(12) United States Patent
Yonekubo et al.

(10) Patent No.: US 7,071,611 B2
(45) Date of Patent: Jul. 4, 2006

(54) DISPLAY PANEL, METHOD OF MANUFACTURING DISPLAY PANEL, AND DISPLAY APPARATUS

(75) Inventors: Masatoshi Yonekubo, Hara-mura (JP); Takashi Takeda, Suwa (JP); Tetsuro Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 105 days.

(21) Appl. No.: 10/939,505

(22) Filed: Sep. 14, 2004

(65) Prior Publication Data

US 2005/0093465 A1 May 5, 2005

(30) Foreign Application Priority Data

Sep. 17, 2003 (JP) .............................. 2003-324625

(51) Int. Cl.
  *H05B 33/12* (2006.01)
  *H05B 33/14* (2006.01)
(52) U.S. Cl. ...................... 313/498; 313/504
(58) Field of Classification Search ............... 315/169; 313/492–512; 345/76–82
See application file for complete search history.

(56) References Cited

U.S. PATENT DOCUMENTS

| | | | | |
|---|---|---|---|---|
| 5,128,587 | A | * | 7/1992 | Skotheim et al. ............ 313/504 |
| 5,200,668 | A | * | 4/1993 | Ohashi et al. ............... 313/498 |
| 5,539,424 | A | * | 7/1996 | Hattori et al. ................. 345/76 |
| 5,552,667 | A | * | 9/1996 | Cho et al. .................... 313/498 |
| 5,707,779 | A | * | 1/1998 | Naito ....................... 430/270.1 |
| 5,965,981 | A | * | 10/1999 | Inoguchi et al. ............ 313/506 |
| 6,797,413 | B1 | * | 9/2004 | Takeishi et al. ............. 428/690 |
| 6,864,638 | B1 | * | 3/2005 | Ishihara et al. ........... 315/169.3 |
| 6,876,007 | B1 | * | 4/2005 | Yamazaki et al. ............. 257/88 |
| 2002/0037430 | A1 | * | 3/2002 | Takeishi et al. ............. 428/690 |
| 2002/0117963 | A1 | * | 8/2002 | Chuman et al. ............. 313/504 |
| 2003/0067266 | A1 | * | 4/2003 | Kim et al. ................... 313/504 |

OTHER PUBLICATIONS

Shingo Kawashima, "Methods For Driving Organic Electroluminescence Displays", *Organic EL Materials and Displays*, CMC, ISBN: 4-88231-284-0 C3054, Chapter 19, pp. 279-289 (w/English translation), no days, months, year.

* cited by examiner

*Primary Examiner*—Don Wong
*Assistant Examiner*—Hung Tran Vy
(74) *Attorney, Agent, or Firm*—Oliff & Berridge, PLC

(57) ABSTRACT

Exemplary embodiments of the present invention provide a display panel or the like in which it is easy to enlarge a size of the display panel. A display panel according to exemplary embodiments includes a first transparent electrode layer and a second transparent electrode layer which are optically transparent, a conductivity-variable layer which is provided on the first transparent electrode layer, and an electroluminescent layer which is provided between the conductivity-variable layer and the second transparent electrode layer, and which emits light by applying a voltage thereto.

12 Claims, 16 Drawing Sheets

工程j

STEP j

STEP k

DISPLAY PANEL, METHOD OF MANUFACTURING DISPLAY PANEL, AND DISPLAY APPARATUS

BACKGROUND OF THE INVENTION

1. Field of Invention

Exemplary embodiments of the present invention relate to a display panel, a method of manufacturing a display panel, and a display apparatus. More particularly, the exemplary embodiments relate to the technology of a display panel for use in a display apparatus which is controllable by light.

2. Description of Related Art

A related art organic electroluminescence (hereinbelow "EL") display, for example, can be employed as an image display apparatus. For example, technology of the organic EL display is disclosed in "Organic EL materials and Displays", CMC, ISBN: 4-88231-284-0 C3054, Chapter 19, "Driving method for Organic EL display", Shingo Kawashima, pp. 279–289.

SUMMARY OF THE INVENTION

The organic EL display in the related art is such that thin film transistor (hereinbelow "TFT") elements made from low-temperature poly-silicon, amorphous silicon or the like are disposed in regions which correspond respectively to pixels. Each TFT element has its ON/OFF state controlled by access which employs current. The organic EL display can be driven in such a way that the ON/OFF states of the respective TFT elements are controlled by employing currents. In a case of increasing the number of pixels, however, when the TFT element is provided for every pixel, also the number of TFT elements increases in accordance with the increase of the number of pixels. When the number of TFT elements increases, the number of electrical wiring lines for accessing the TFT elements with currents also increases. A decrease of a yield may result when the construction of the organic EL display becomes complicated. Accordingly, when the number of pixels is increased in order to enlarge the size of a screen, the manufacturing cost of the organic EL display rises suddenly in some cases.

Since the increase of the number of TFT elements results in increasing also the number of electrical wiring lines, an increase of an electrical resistance may be incurred. When the electrical resistance increases, it becomes difficult to make the accesses by causing sufficient currents to pervade all the TFT elements. Further, it is very difficult to manufacture a large-sized screen which is free from the dispersion of the TFT elements. When the TFT elements of the screen disperse, a display image becomes nonuniform. In this manner, the uniform manufacture of the TFT elements is difficult in addition to the possible sudden rise of the manufacturing cost, so that the manufacture of the large-sized screen is difficult. Thus, the related-art organic EL display is problematic in the case of enlarging the size of the screen, because of the difficulty in the driving aspect in the accesses to the TFT elements, and the difficulty in the manufacturing aspect. Exemplary embodiments of the present invention have been made in view of the above discussed and/or other problems. Further, exemplary embodiments provide a display panel which can easily be enlarged a size, a method of manufacturing the display panel, and a display apparatus employing the display panel.

In order to address or solve the above discussed and/or other problems, exemplary embodiments of the present invention provide a display panel characterized by including a first transparent electrode and a second transparent electrode which are optically transparent; a conductivity-variable layer which is provided on the first transparent electrode layer; and an EL layer which is provided between the conductivity-variable layer and the second transparent electrode layer, and which emits light by applying a voltage thereto. A predetermined voltage is applied between the first transparent electrode layer and the second transparent electrode layer, and the conductivity-variable layer has its electrical conductivity changed in accordance with a light quantity of control light transmitted through the first transparent electrode layer. The EL layer emits the light in such a way that the voltage in the predetermined voltage that corresponds to the conductivity of the conductivity-variable layer, is applied thereto when the conductivity of the conductivity-variable layer has been changed in accordance with the light quantity of the control light transmitted through the first transparent electrode layer.

The display panel of exemplary embodiments of the present invention is driven by entering the control light into the first transparent electrode layer.

When the control light is not entered, the conductivity-variable layer functions as an insulating layer whose electrical conductivity is substantially zero. Besides, when the control light is entered, the conductivity-variable layer has its electrical conductivity changed in accordance with the light quantity of the control light transmitted through the first transparent electrode layer. When the predetermined voltage is applied and held between the first transparent electrode layer and the second transparent electrode layer, the voltage in the predetermined voltage that corresponds to the light quantity of the control light can be applied to the EL layer. The voltage corresponding to the light quantity of the control light is applied to the EL layer, whereby this EL layer emits the light in correspondence with the light quantity of the control light. In this way, the display panel can have its drive controlled by accessing it with the control light (light addressing). Since the display panel of exemplary embodiments of the present invention is controllable by entering the control light thereinto, it need not be provided with TFT elements. Whereas the TFT elements need to be disposed in respective regions corresponding to pixels, the conductivity-variable layer, first transparent electrode layer and second transparent electrode layer, can be formed by forming films uniformly over the whole substrate, so that the display panel of exemplary embodiments of the present invention can be manufactured with ease. Moreover, the respective pixels can be accessed by the construction which allows the control light to scan, so that they need not be electrically accessed. For this reason, electrical wiring lines do not have to be laid for the respective pixels. Therefore, the display panel of exemplary embodiments of the present invention can be made simpler in construction than a related-art EL display. Owing to the simplified construction of the display panel, the yield thereof can be increased to curtail manufacturing costs.

With the TFT elements, as the number of pixels increases by enlarging the size of a screen, it becomes difficult to manufacture a display which is free from the dispersion of the TFT elements. Besides, with the enlargement of the size of the screen and the increase of the number of pixels, also wiring lines for electrically connecting the TFT elements increase, and hence, there is the problem that an electrical resistance increases. In contrast, the display panel of exemplary embodiments of the present invention can be manufactured by chiefly forming the films of materials constituting the respective layers, uniformly over the whole substrate, so that even a large-sized screen is easy to manufacture. Besides, the display panel of exemplary embodiments of the present invention need not electrically access the respective pixels, so that an electrical resistance does not increase even when the number of pixels is increased. Since the electrical resistance is not increased even by the increase of the number of pixels, even a large-sized display panel can have its drive controlled with ease as long as the control light can be entered into the whole display panel. Further, owing to the non-increase of the electrical resistance and also to the low dissipation power of the EL layer itself, dissipation power in the case of enlarging the size of the display panel can be decreased. Thus, the display panel whose size can easily be enlarged, is obtained.

According to an exemplary aspect of the present invention, the EL layer should desirably have a structure in which it is divided into a plurality of regions corresponding to pixels. Thus, it is possible to obtain a display panel which can emit light for the respective pixels in accordance with an image signal, so as to display an image.

According to an exemplary aspect of the present invention, a display panel should desirably include a light shield portion which is provided near a surface of the first transparent electrode layer where the control light is entered, and which is formed with openings in correspondence with the pixel. Each of the openings are arranged at a position through which the control light is passed, thereby to be entered into a position of the first transparent electrode layer as corresponds to a predetermined one of the pixel. The EL layer emits the light on the pixel basis in such a way that the control light passed through the opening is entered into only the part of the first transparent electrode layer corresponding to the predetermined pixel. After having passed through the openings provided in the light shield portion, the control light is entered into the first transparent electrode layer. Each of the openings is arranged at the position through which the control light is passed to be entered into the part of the first transparent electrode layer corresponding to the predetermined pixel. Thus, the control light can be entered into only the part of the first transparent electrode layer corresponding to the predetermined pixel.

In a case where the control light has proceeded toward the part of the first transparent electrode layer corresponding to any pixel different from the predetermined pixel, it is intercepted by the light shield portion. In this manner, the light shield portion and the openings corresponding to the pixels are provided, whereby the control light can be reduced or prevented from erroneously entering the region which corresponds to the pixel other than the predetermined pixel. In a case where a plurality of control lights are entered into regions which correspond to pixels different from one another, it is allowed to employ a construction in which the plurality of control lights are passed through one opening. Accordingly, the control lights are allowed to scan at a precision enough to enter into the opening, whereby the control lights can precisely enter into only the parts of the first transparent electrode layer corresponding to predetermined pixels even when the entrance positions of the control lights are not controlled at a still higher precision. Moreover, since the scanning speed of the control lights does not have to be made slow, the light addressing can be precisely performed without degrading the quality of an image. Thus, a precise control can be performed with ease.

An exemplary aspect of the present invention, the EL layer should desirably have a structure in which it is divided into a plurality of regions corresponding to the pixels, by a plurality of partition members provided on the conductivity-variable layer. The EL layer is made as the structure divided into the plurality of pixels, by providing the partition members on the conductivity-variable layer. Thus, it is possible to obtain a display panel which can emit light for the respective pixels in accordance with an image signal, so as to display an image.

As an exemplary aspect of the present invention, it is desirable that the EL layer include a reflection electrode which is provided in correspondence with the pixels, on its surface on a side which lies in touch with the conductivity-variable layer. Further, the reflection electrode has a region which is larger than a region of the EL layer that corresponds to each of the pixels. The partition members are provided on the conductivity-variable layer.

Herein, when the control light has entered the position of the first transparent electrode layer corresponding to the partition member, the conductivity-variable layer has its conductivity changed only under the partition member. When the conductivity of the conductivity-variable layer changes only under the partition member, it is sometimes difficult or impossible to apply a sufficient voltage to the EL layer, so the EL layer fails to emit light. Here, since the display panel of exemplary embodiments of the present invention dispense with TFT elements, electric wiring lines does not need to be laid under the partition members. Therefore, the regions of the reflection electrode can be spread to spaces underlying the partition members.

When the peripheral part of the reflection electrode is provided so as to be held between the partition members and the conductivity-variable layer, the region of the reflection electrode corresponding to each pixel becomes larger than the part of the EL layer divided into pixels by the partition members, to the amount of a region held between the partition members and the conductivity-variable layer. Since the region of the reflection electrode corresponding to each pixel can be made larger than the region of the part of the EL layer divided by the partition members, it is possible to utilize the control light which has entered a larger area than in the case where the reflection electrode is divided in correspondence with the pixels similarly to the EL layer. Besides, since the control light having entered the larger area can be utilized, the control of the display panel can be satisfactorily performed even when it is difficult to control the entrance position of the control light at a high precision. Thus, the EL layer can efficiently emit light.

As an exemplary aspect of the present invention, the conductivity-variable layer should desirably have a structure in which it is divided into a plurality of regions corresponding to the pixels. A region in which the conductivity of the conductivity-variable layer changes, tends to spread to the surroundings around the irradiation position of the control light in proportion to the intensity of the control light and the irradiation time period thereof. When the conductivity-variable layer is made as the structure in which, similar to the structure of the EL layer, it is divided into the plurality of regions corresponding to the pixels, the parts of the EL layer corresponding to predetermined pixels can precisely emit light by the control light. Moreover, even when it is difficult to control the entrance position of the control light at a high precision, the control of the display panel can be satisfactorily performed. Thus, a display panel capable of precise control is obtained.

As an exemplary aspect of the present invention, it is desirable that the plurality of regions of the EL layer are provided in correspondence with pixels for first color light, pixels for second color light, and pixels for third color light. Each pixel aggregate is constructed of one of the pixels for the first color light, one of the pixels for the second color light, and one of the pixels for the third color light and that a plurality of such pixel aggregates are provided at substantially equal intervals in two predetermined directions being substantially orthogonal to each other. A full-color image is displayed by the pixels for the first color light, the pixels for the second color light, and the pixels for the third color light. When each pixel aggregate is constructed of the pixel for the first color light the pixel for the second color light, and the pixel for the third color light, the pixels can be densely arrayed. When the pixels can be densely arrayed, the aperture percentage of the display panel is enhanced, and a bright image is obtained. Further, since the plurality of pixel aggregates are arrayed at the substantially equal intervals in the two-dimensional directions, the distortion of an image can be reduced to precisely display the image. Thus, a bright and precise full-color image is obtained.

Further, according to exemplary embodiments of the present invention, it is possible to provide a method of manufacturing a display panel, characterized by including forming a first transparent electrode layer on a substrate; forming a conductivity-variable layer on the first transparent electrode layer formed at the first-transparent-electrode-layer formation; forming partition members in a predetermined pattern on the conductivity-variable layer formed at the conductivity-variable-layer formation; forming an EL layer among the partition members formed at the partition-member formation; forming a second transparent electrode layer on the partition members formed at the partition-member formation, and an EL layer formed at the EL-layer formation; and forming a protective layer on the second transparent electrode layer formed at the second-transparent-electrode-layer formation. Thus, the display panel stated before can be manufactured. Besides, since the display panel stated before dispenses with TFT elements, the layers of parts, which are other than the partition members for defining the pixels and the EL layer provided in correspondence with the pixels, can be formed by forming films over the whole surface of the substrate. Therefore, the display panel can be manufactured with ease.

Further, according to exemplary embodiments of the present invention, it is possible to provide a method of manufacturing a display panel, characterized by including forming a first layered structure which has a first substrate, a first transparent electrode layer and a conductivity-variable layer, the first-layered-structure formation including forming the first transparent electrode layer on the first substrate; and forming the conductivity-variable layer on the first transparent electrode layer formed at the first-transparent-electrode-layer formation; forming a second layered structure which has a second substrate, a second transparent electrode layer, partition members and an electroluminescent layer. The second-layered-structure formation includes forming the second transparent electrode layer on the second substrate; forming the partition members in a predetermined pattern on the second transparent electrode layer formed at the second-transparent-electrode-layer formation; and forming the EL layer on those regions of the second transparent electrode layer which are surrounded with the partition members formed at the partition-member formation; and sticking to each other the conductivity-variable layer formed at the first-layered-structure formation, and the EL layer formed at the second-layered-structure formation, thereby to unite the first layered structure formed at the first-layered-structure formation, and the second layered structure formed at the second-layered-structure formation.

In a case where a display panel is provided with TFT elements, it needs to be manufactured so that the positions of the electrodes of the TFT elements may be registered with the positions of an EL layer corresponding to pixels. In contrast, the display panel stated before dispenses with the TFT elements. The EL layer does not have to have its positions registered as in the case of providing the TFT elements, and it may well be constructed in correspondence with pixels, on the conductivity-variable layer formed over the whole surface of the first substrate. Therefore, the first layered structure which is formable over the whole surface of the first substrate, and the second layered structure which has the structure corresponding to the pixels, can be respectively formed as separate members. Besides, the first layered structure and the second layered structure are stuck to each other into the unitary structure, whereby the display panel can be manufactured. In this case, the second layered structure can be formed by successively stacking the second transparent electrode layer and the EL layer on the second substrate. When the second layered structure can be formed by successively stacking the respective layers on a protective layer which is the second substrate, the protective layer can be made a more rigid member than in a case of forming the protective layer on the layered structure which corresponds to the pixels. According to exemplary embodiments of the present invention, the protective layer of the display panel can be made rigid, so that the manufactured display panel can be used for a long term.

Further, according to exemplary embodiments of the present invention, it is possible to provide a display apparatus characterized by including a display panel; a power source which applies a voltage to the display panel; and an optical system for control light, which supplies the control light to the display panel. The display panel is the display panel stated before, and the power source applies the voltage between the first transparent electrode layer and the second transparent electrode layer of the display panel. The optical system for the control light enters the control light into the first transparent electrode layer of the display panel. The display apparatus of exemplary embodiments of the present invention is controlled by entering the control light from the optical system for the control light. The voltage to cause the EL layer to emit light is applied between the first transparent electrode layer and the second transparent electrode layer. Since the voltage to cause the EL layer to emit light is applied by the power source, the intensity of the control light many be to the extent of changing the electrical conductivity of the conductivity-variable layer. Therefore, the optical system for the control light can be used for the display apparatus of exemplary embodiments of the present invention even when it is difficult to generate control light of high intensity. Since the control light of high intensity need not be generated, the display apparatus can be used safely. Besides, since the display panel stated before is used, dissipation power is low, and the enlargement of the size of the display panel is easy.

Further, the optical system for the control light scans the first transparent electrode layer with the control light of beam shape. The display apparatus of exemplary embodiments of the present invention does not require a vacuum tube as in, for example, a display apparatus employing a CRT, so that it can be made light in weight even when the display panel is made large in size. Moreover, unlike in a case of employing an electron beam, the control light can have its proceeding direction deflected by a mirror and can be fined by a lens. Therefore, even when the display apparatus is thinned, the control light can scan over the whole large-sized display panel by, for example, bending the proceeding direction of the control light with a mirror. Further, by bending the proceeding direction of the control light, the optical path of the control light becomes long with the display apparatus kept small in size. Therefore, the scanning angle of the control light can be narrowed. Thus, a display apparatus capable of easily enlarging the size of the display panel is obtained.

As an exemplary aspect of the present invention, the optical system for the control light should desirably pass the control light through each opening, thereby to enter it into the position of the first transparent electrode layer corresponding to the predetermined pixel. Each of the openings of the display panel is arranged at the position through which the control light is passed to be entered into the part of the first transparent electrode layer corresponding to the predetermined pixel. The optical system for the control light passes the control light through the opening, thereby to enter it into the position of the first transparent electrode layer corresponding to the predetermined pixel. Thus, the control light can precisely enter into the part of the first transparent electrode layer corresponding to the predetermined pixel. Besides, in a case, for example, where an EL layer for R-light, an EL layer for G-light and an EL layer for B-light are driven by control lights different from one another, it is also possible to employ a construction in which the control lights to be entered into the EL layers for the respective color lights are passed through one opening. On this occasion, the control lights scan at a precision enough to enter into the opening, whereby the control lights can precisely enter into the EL layers for the respective color lights even when the entrance positions of the control lights are not controlled at a still higher precision. Thus, a precise control can be performed with ease.

Besides, as a preferable aspect of exemplary embodiments of the present invention, it is desirable that the optical system for the control light includes a plurality of light source units for the control lights; that each of the light source units for the control lights consists of a first light source portion for the control light to supply the first control light to the part of the first transparent electrode layer corresponding to the pixel for the first color light, a second light source portion for the control light to supply the second control light to the part of the first transparent electrode layer corresponding to the pixel for the second color light, and a third light source portion for the control light to supply the third control light to the part of the first transparent electrode layer corresponding to the pixel for the third color light. The plurality of light source units for the control lights supply the first control light, the second control light and the third control light to different regions of the display panel, respectively.

The control lights are supplied in such a way that the respective light source units for the control lights take charge of the different regions of the display panel, whereby distances from galvanomirrors to the display panel can be shortened. Moreover, the control lights are supplied by allotting the different regions of the display panel to the light source units, whereby the scanning angles of the control lights can be narrowed. Since the scanning distances of the control lights are shortened, an image display can be satisfactorily performed even when the scanning speeds of the control lights are lowered. Thus, the display apparatus can be made small in size and the control lights can be easily allowed to scan.

As an exemplary aspect of the present invention, it is desirable to include a frame in which, at least, the optical system for the control lights is accommodated; the display panel being mounted on the frame. Since the display panel stated before is mounted on the frame, the frame can be made light in weight and thin in structure even when the display panel is enlarged in size. Thus, a display apparatus which can easily enlarge the size of the display panel, is obtained.

As an exemplary aspect of the present invention, it is desirable that light from another image display apparatus is employed as the control light. The display panel is arranged with the first transparent electrode layer thereof held in opposition to the display of the other image display apparatus, and the light from the display is entered into the first transparent electrode layer of the display panel as the control light. The conductivity-variable layer has its conductivity changed in accordance with the light quantity of the light from the display, at its position corresponding to that position of the first transparent electrode layer into which the light from the display has been entered. Therefore, even in a case where the EL layer is provided uniformly over the whole surface of the display panel, it can be caused to emit light in accordance with the position and light quantity of the light from the display as has been entered into the first transparent electrode layer, thereby to display an image. In this way, the display panel can be driven by entering the light from the display into the first transparent electrode layer.

Further, color filters are provided on the entrance side of the display panel for the light from the display and on the exit side of the display panel for the emitted light, whereby a full-color image can be obtained in the display panel. Thus, a display panel capable of displaying the image of the other image display apparatus is obtained with the simple construction.

BRIEF DESCRIPTION OF THE DRAWINGS

FIG. 2-1 is a schematic showing an example of use of a display panel;

FIG. 2-2 is a schematic showing the image of a display being displayed on a display panel;

FIG. 6-1 is a schematic showing a layout example of individual pixels for color lights;

FIG. 6-2 is a schematic showing a layout example of individual pixels for color lights;

FIG. 6-3 is a schematic showing a layout example of individual pixels for color lights;

FIG. 7-1 is a schematic showing the procedure of a first exemplary manufacturing method for the display panel;

FIG. 7-2 is a schematic showing the procedure of the first exemplary manufacturing method for the display panel;

FIG. 7-3 is a schematic showing the procedure of the first exemplary manufacturing method for the display panel;

FIG. 8-1 is a schematic showing the procedure of a second exemplary manufacturing method for the display panel;

FIG. 8-2 is a schematic showing the procedure of the second exemplary manufacturing method for the display panel;

FIG. 8-3 is a schematic showing the procedure of the second exemplary manufacturing method for the display panel;

DETAILED DESCRIPTION OF PREFERRED EMBODIMENTS

Now, exemplary embodiments of the present invention will be described in detail with reference to the drawings.

Exemplary Embodiment 1

Figure 1:
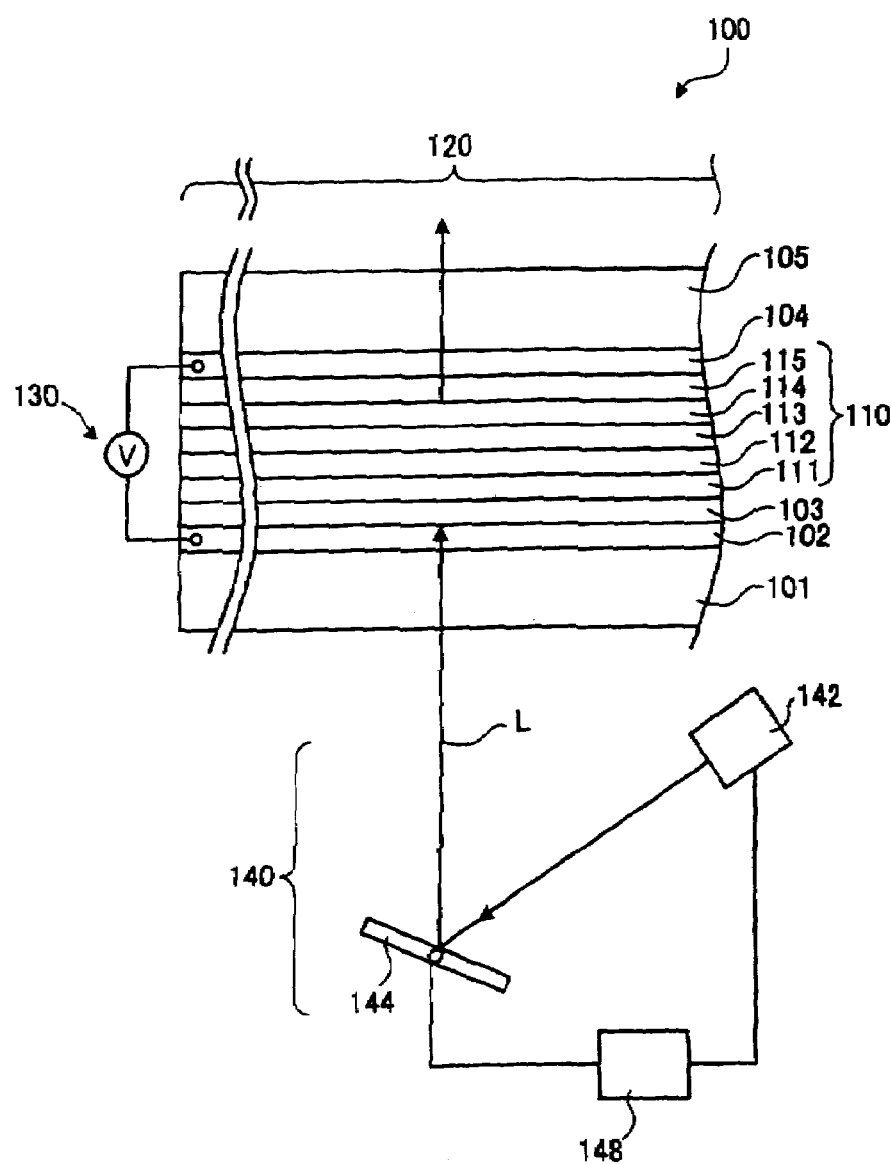
FIG. 1 is a schematic constructional view showing a display apparatus according to Exemplary Embodiment 1 of the present invention.

FIG. 1 is a schematic construction showing a display apparatus 100 according to Exemplary Embodiment 1 of the present invention. In this exemplary embodiment, the construction of the display apparatus 100 and a control by control light will be first described, and practicable image displays based on the display apparatus 100 will be subsequently described. The display apparatus 100 is constructed of a display panel 120, a power source 130, and an optical system for control light, 140. The display panel 120 displays an image by causing an organic EL layer 110 to emit light.

A substrate 101 is a parallel flat plate which is made of a glass member, a polymer member or the like which is optically transparent. A first transparent electrode layer 102 being optically transparent, and a conductivity-variable layer 103 are successively stacked on the substrate 101. The first transparent electrode layer 102 can be made of an ITO film. The conductivity-variable layer 103 has its electrical conductivity changed by the control light L transmitted through the first transparent electrode layer 102. Amorphous silicon (hereinbelow, termed "a-Si") or a photosensitive organic film, for example, can be employed for the conductivity-variable layer 103. The a-Si, for example, should desirably contain hydrogen. The a-Si is formed by chemical vapor deposition (CVD). In a state where the a-Si is not irradiated with the control light L at all, the a-Si functions as an insulating member whose electrical conductivity is substantially zero (that is, whose resistance value is infinitely large). In contrast, when the a-Si is irradiated with the control light L, the conductivity enlarges (that is, the resistance value becomes small) in accordance with the quantity of the light. That region of the conductivity-variable layer 103 in which the conductivity changes corresponds to that region of the first transparent electrode layer 102 which has irradiated the a-Si with the control light L.

The organic EL layer 110 is provided on the conductivity-variable layer 103. The organic EL layer 110 is constructed in such a way that a reflection electrode 111, an ITO film 112, a hole transport layer 113, an organic light emission layer 114 and an electron transport layer 115 are successively stacked from the side of the conductivity-variable layer 103. The reflection electrode 111 can be constructed by evaporating a metal, for example, aluminum (Al). The ITO film 112 is provided in order to promote the emission of charges from the reflection electrode 111 into the hole transport layer 113. A triazole derivative, for example, can be employed as the material of the hole transport layer 113. A benzothiazolic compound, for example, can be employed for the organic light emission layer 114. An electron-transmissive compound, for example, diphenylquinone derivative can be employed for the electron transport layer 115. Since any of the hole transport layer 113, organic light emission layer 114 and electron transport layer 115 has a thickness on the order of several tens nm, it is optically transparent. A second transparent electrode layer 104 can be made of an ITO film likewise to the first transparent electrode layer 102. A protective layer 105 which is made of an optically transparent member similar to the substrate 101, is provided on the second transparent electrode layer 104. Herein, the display panel 120 has a voltage applied between the first transparent electrode layer 102 and the second transparent electrode layer 104 by the power source 130.

As methods for stacking the individual layers which constitute the display panel 120, it is possible to appropriately employ resistance-heating vacuum evaporation, electron-beam-heating vacuum evaporation, sputtering, ion plating, casting, spin coating, and so forth. Incidentally, the construction of the organic EL layer 110 is not restricted to the above one. By way of example, a bonding layer may well be provided for any of the individual layers constituting the organic EL layer 110.

Besides, a hole transport material and an electron transport material may well be mixed into the organic light emission layer 114 by providing neither of the hole transport layer 113 and the electron transport layer 115. If the charges of the reflection electrode 111 can be sufficiently emitted into the hole transport layer 113, the ITO film 112 may well be omitted.

The optical system for the control light, 140 is constructed of a galvanomirror 144, and a light source portion for the control light, 142. The optical system for the control light, 140 is disposed for the display panel 120 and on the side of the substrate 101. The light source portion for the control light, 142 supplies the control light L which is beam-shaped light, for example, laser light. By way of example, a semiconductor laser element or a surface-light-emission laser element which is furnished with a modulator can be employed for the light source portion for the control light 142. Herein, the light source portion for the control light 142 can modulate the intensity of the control light L in accordance with an image signal from a control portion 148, so as to supply the modulated light. The control light L from the light source portion for the control light 142 is reflected toward the display panel 120 by the galvanomirror 144. Besides, the control light L reflected toward the display panel 120 enters that surface of the display panel 120 which lies on the side of the substrate 101. The galvanomirror 144 can be fabricated by, for example; MEMS (Micro Electro Mechanical Systems) technology. The galvanomirror 144 turns about two predetermined axes being substantially orthogonal to each other, thereby allowing the control light L to scan in two directions. The turning of the galvanomirror 144 is controlled in accordance with the image signal by the control portion 148. In this way, the optical system for the control light, 140 scans that surface of the display panel 120 which lies on the side of the substrate 101 with the control light L.

Employed as the control light L is light in a wavelength region which is capable of changing the electrical conductivity of the conductivity-variable layer 103. On this occasion, in a case where the control light L has a wavelength region which is adapted to change the electrical conductivity of the conductivity-variable layer 103 most efficiently, the control light L in a small light quantity can be employed. Besides, even in a case where the control light L is in a wavelength region which is not the wavelength region adapted to change the electrical conductivity of the conductivity-variable layer 103 most efficiently, it can be employed for the control of the display panel 120 by enlarging the light quantity of the control light L. Thus, the display panel 120 can be controlled by appropriately combining the wavelength and light quantity of the control light L. Any of an ultraviolet laser, a visible radiation laser and an infrared laser can be employed for the control light L. Besides, not only the laser light, but also the beam-shaped light, for example, light from a light emitting diode element (LED) may well be employed as the control light L.

Next, the control of the display apparatus 100 by the control light L will be described. The control light L from the optical system for the control light, 140 is transmitted through the substrate 101 and first transparent electrode layer 102 of the display panel 120, and enters the conductivity-variable layer 103. When the control light L whose intensity corresponds to an image signal, has entered the conductivity-variable layer 103, the electrical conductivity of this layer increases in accordance with the light quantity of the control light L as to the part thereof at the entrance position of the control light L. Incidentally, strictly speaking, a region where the conductivity of the conductivity-variable layer 103 changes tends to spread to the surroundings around the irradiation position in proportion to the intensity and irradiation time period of the control light L. Here, the control shall be discussed assuming that the control light L scans at high speed by the galvanomirror 144, and that the conductivity changes only in and near the region irradiated with the control light L.

Owing to the increase of the conductivity of the conductivity-variable layer 103, one electrode of the power source 130 as is connected with the first transparent electrode layer 102, is electrically connected with the reflection electrode 111 via the first transparent electrode layer 102 and the conductivity-variable layer 103. Since the conductivity of the conductivity-variable layer 103 changes in accordance with the light quantity of the control light L transmitted through the first transparent electrode layer 102, a voltage corresponding to the light quantity of the control light L is applied to the reflection electrode 111. Besides, the other electrode of the power source 130 is held connected to the second transparent electrode layer 104. When a voltage is applied between the reflection electrode 111 and the second transparent electrode layer 104, the charges of the reflection electrode 111 are emitted into the hole transport layer 113 through the ITO film 112. When the charges are emitted into the hole transport layer 113, holes are transmitted from the hole transport layer 113 into the organic light emission layer 114. Further, when the voltage is applied between the reflection electrode 111 and the second transparent electrode layer 104, electrons are transported from the electron transport layer 115 into the organic light emission layer 114. In the organic light emission layer 114, the holes from the hole transport layer 113 combine with the electrons from the electron transport layer 115. The fluorescent substance of the organic light emission layer 114 is excited by energy which is generated at the combination between the hole and the electron. Herein, when the excited fluorescent substance reverts into its ground state, a fluorescence phenomenon occurs to emit light from the organic light emission layer 114.

The light from the organic light emission layer 114 proceeds in all directions around that position of the organic light emission layer 114 which corresponds to the entrance position of the control light L. The light which has proceeded from the light emission position of the organic light emission layer 114 toward the protective layer 105, is transmitted through the electron transport layer 115, second transparent electrode layer 104 and protective layer 105 and exits from the display panel 120. Besides, the light which has proceeded from the light emission position of the organic light emission layer 114 toward the substrate 101 is transmitted through the hole transport layer 113 and ITO film 112 and is reflected by the reflection electrode 111. The light reflected by the reflection electrode 111 is transmitted through the individual layers and proceeds toward the protective layer 105, and exits from the display panel 120. An observer observes the light which exits from the protective layer 105 of the display panel 120. Since the reflection electrode 111 reflects the light proceeding toward the substrate 101, toward the protective layer 105, the light from the organic light emission layer 114 can be caused to efficiently exit from the display panel 120.

In this manner, the display panel 120 is provided with the conductivity-variable layer 103, and the control light L is entered into the first transparent electrode layer 102, whereby the voltage corresponding to the light quantity of the control light L, in the voltage applied between the first transparent electrode layer 102 and the second transparent electrode layer 104, is applied to the organic EL layer 110. Owing to the voltage corresponding to the light quantity of the control light L, the organic light emission layer 114 can be caused to emit the light in accordance with the image signal. In the display panel 120 in this exemplary embodiment, the organic EL layer 110 is not divided into pixels, and it is provided uniformly over the whole surface of the display panel 120. As stated above, the conductivity-variable layer 103 has its conductivity changed only in and near the region irradiated with the control light L. Owing to the change of the conductivity of only the region irradiated with the control light L, when the control light L is entered into the organic light emission layer 114, this layer can be caused to emit the light in correspondence with the entrance position of the control light L. Therefore, when the entrance positions of the control light L are controlled using the optical system for the control light, 140, the organic light emission layer 114 can be caused to emit light on the pixel basis in accordance with the image signal, thereby to display an image (light addressing).

The voltage for causing the organic light emission layer 114 is applied between the first transparent electrode layer 102 and the second transparent electrode layer 104 by the power source 130. In this exemplary embodiment, in the case of performing the light addressing with the control light L, the intensity of the control light L may be to the extent of changing the electrical conductivity of the conductivity-variable layer 103. In this exemplary embodiment, the control light L of lower intensity can be employed than in a case where light is emitted for image display by directly employing the energy of the control light L. For this reason, the light source portion for the control light 142, is usable for the display apparatus 100 even when it is difficult to generate control light L of high intensity. Therefore, the light source portion for the control light 142 whose output power is low and which is inexpensive, may well be employed for the optical system for the control light 140. Moreover, since the control light L of high intensity does not need to be generated, the safety of the display apparatus 100 can be enhanced. Further, the display apparatus 100 of this exemplary embodiment can use visible radiation or the like as the control light L. Since an electron beam, for example, does not need to be employed as the control light L, a vacuum tube or the like member as in a display apparatus including a CRT, is not required. Since the vacuum tube or the like member is not required, the display apparatus 100 can be made light, in weight even when the display panel 120 is enlarged in size. This brings forth the advantage that the display apparatus 100 which can easily enlarge the size of the display panel 120, is obtained.

The display apparatus 100 controls the drive of the display panel 120 with the control light L. Accordingly, the display panel 120 in this exemplary embodiment need not be provided with TFT elements. Whereas the TFT elements need to be disposed for the respective pixels, the conductivity-variable layer 103, first transparent electrode layer 102, organic EL layer 110 and second transparent electrode layer 104 of the display panel 120 can be formed by forming films uniformly over the whole substrate 101, respectively. Therefore, patterning is unnecessary in the manufacturing process of the display panel 120, so that the manufacture of the display panel 120 is easier than in the case of providing the TFT elements. Moreover, the respective pixels can be accessed by the construction which scans with the control light L, so that the pixels do not need to be electrically accessed. Since the respective pixels do not need to be electrically accessed, electrical wiring lines do not be laid for the respective pixels. Therefore, the display panel 120 in this exemplary embodiment can be made simpler in construction than the related-art EL display. Owing to the simplified construction of the display panel 120 and also the easy manufacture thereof, the yield thereof can be improved to curtail a manufacturing cost.

Since the display panel 120 can be manufactured by forming the materials of the respective layers into the films uniformly over the substrate 101, the manufacture is easy even in the case of enlarging the size of the display panel 120. Besides, when the TFT elements are employed, the number of wiring lines for electrically connecting the TFT elements increases with the enlargement of the size of a screen. Therefore, the employment of the TFT elements poses the problem that an electrical resistance increases with the enlargement of the size of the screen. In contrast, the display panel 120 in this exemplary embodiment dispenses with the electrical accesses to the respective pixels, so that an electrical resistance is not increased even by increasing the number of pixels. Since the electrical resistance does not increase, even a large-sized display panel 120 can have its drive more easily controlled as long as the control light L can be entered into the whole display panel 120 by the optical system for the control light 140. Besides, a PDP (plasma display panel), for example, dissipates more power with the enlargement of its size. When the display panel 120 is compared with the PDP, the organic EL layer 110 dissipates low power even in the case of enlarging the size. In this manner, the electrical resistance does not increase, and besides, the dissipation power of the organic EL layer 110 itself is low, the dissipation power of the display apparatus 100 can be lowered even in the case of enlarging the size of the display panel 120. This brings forth the advantage that the display panel 120 which is easy of enlarging its size is obtained.

Next, image displays based on the display apparatus 100 of this exemplary embodiment will be concretely described. In the display panel 120 of the display apparatus 100, the organic EL layer 110 is not divided into pixels, and it is provided uniformly over the whole surface of the display panel 120. When light addressing is performed using the optical system for the control light 140, the display panel 120 displays a monochromatic image of identical color by light which has a wavelength corresponding to energy generated when the fluorescent substance excited by the organic light emission layer 114 reverts into its ground state. The display panel 120 is used for the display apparatus 100 which displays the image by using the optical system for the control light 140 in this manner, and it can also be used for loading the image of the display of another image display apparatus thereinto and then displaying the loaded image.

Figures 1, 2:
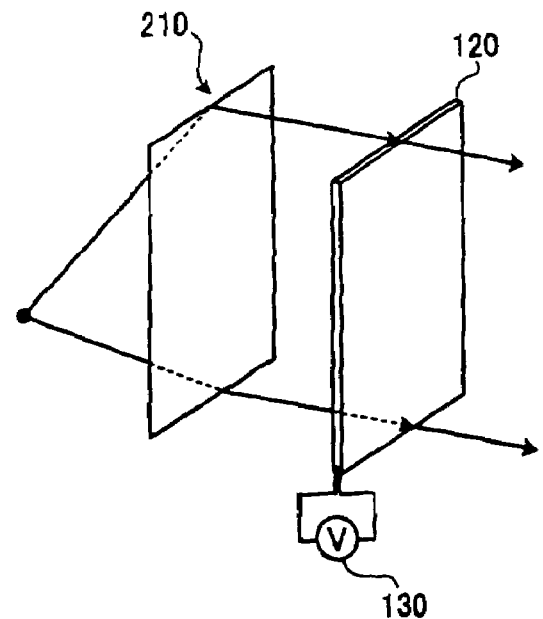
Figure 2:
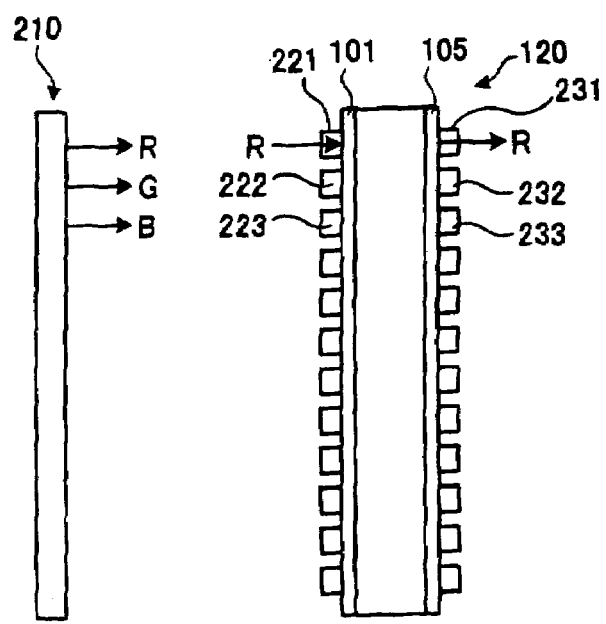

FIG. 2-1 is a schematic showing the image of the display 210 of another image display apparatus displayed by the display apparatus 100. A CRT display, for example, can be employed as the display 210. The display panel 120 and the display 210 are arranged so that the display surface of the display 210 and the side of the substrate 101 (refer to FIG. 1) of the display panel 120 may be opposed to each other, and that their whole surfaces may be placed on each other. The display 210 emits light to display the image.

In a case where light which corresponds to one pixel constituting the image of the display 210, enters into the display panel 120, the light from the display 210 enters into the display panel 120 as control light, the conductivity of the conductivity-variable layer 103 (refer to FIG. 1) changes just as in the case where the control light L is allowed to scan by the galvanomirror 144. The conductivity-variable layer 103 has the electrical conductivity changed in accordance with the light quantity of the light from the display 210 as transmitted through the first transparent electrode layer 102, at its position which corresponds to the pixel of the display 210.

Owing to the change of the conductivity of the conductivity-variable layer 103, that voltage of a predetermined voltage which corresponds to the conductivity of the conductivity-variable layer 103 is applied to the organic EL layer 110 (refer to FIG. 1). Consequently, the organic EL layer 110 emits light in accordance with the light quantity of the light from the display 210 as transmitted through the first transparent electrode layer 102, at the position corresponding to the pixel of the display 210. When lights from the respective pixels of the display 210 are entered and loaded into the display panel 120, the organic EL layer 110 emits lights in correspondence with the positions of and light quantities from the respective pixels of the display 210. Since the organic EL layer 110 emits the lights in correspondence with the positions of and light quantities from the respective pixels of the display 210, the image of the display 210 can be displayed on the display panel 120. This brings forth the advantage that the image of the display 210 of the other image display apparatus can be displayed by the simple construction.

As shown in FIG. 2-2, color filters may well be disposed on the entrance side of the display panel 120 for the light from the display 210 and on the exit side of the display panel 120 for the emitted light thereof. By way of example, R-light transmitting color filters 221 and 231, G-light transmitting color filters 222 and 232, and B-light transmitting color filters 223 and 233 are arrayed on the surface of the substrate 101 of the display panel 120 and the surface of the protective layer 105 thereof, respectively. At a part provided with the R-light transmitting color filter 221, the light of an R-component in the light emitted from the display 210 is transmitted through this filter. In contrast, the lights of a G-component and a B-component having entered the R-light transmitting color filter 221 are absorbed without being transmitted through this R-light transmitting color filter 221. That part of the organic light emission layer 114 (refer to FIG. 1) which corresponds to a part provided with the R-light transmitting color filter 221, emits light in correspondence with the light quantity of the R-component light transmitted through this R-light transmitting color filter 221.

On this occasion, the emitted light in the display panel 120 is light in a color which corresponds to energy that is generated when the fluorescent substance excited by the organic light emission layer 114 reverts into its ground state. Besides, the R-light transmitting color filter 231 is disposed at a position corresponding to the R-light transmitting color filter 221. Therefore, only the light of the R-component in the emitted light at the part provided with the R-light transmitting color filter 221 is transmitted through the R-light transmitting color filter 231. The light of the G-component and that of the B-component are absorbed without being transmitted through the R-light transmitting color filter 231. In this way, the R-light is generated from the part provided with the R-light transmitting color filter 231, in accordance with the light quantity of the R-component light having entered the R-light transmitting color filter 221.

Likewise to the R-light stated above, G-light and B-light are generated from parts provided with the G-light transmitting color filter 232 and the B-light transmitting color filter 233, respectively. Thus, a full-color image can be obtained in the display panel 120. Incidentally, the display 210 is not restricted to the CRT display, but it may well be another display, for example, a liquid crystal panel or a projector employing a micromirror array device. Further, exemplary embodiments of the present invention are not restricted to the case of employing the display 210, but a static picture depicted on, for example, a transparent film may well be projected on the display panel 120 by employing a light source device. Thus, the static picture depicted on the transparent film can be displayed by the display panel 120.

Exemplary Embodiment 2

Figure 3:
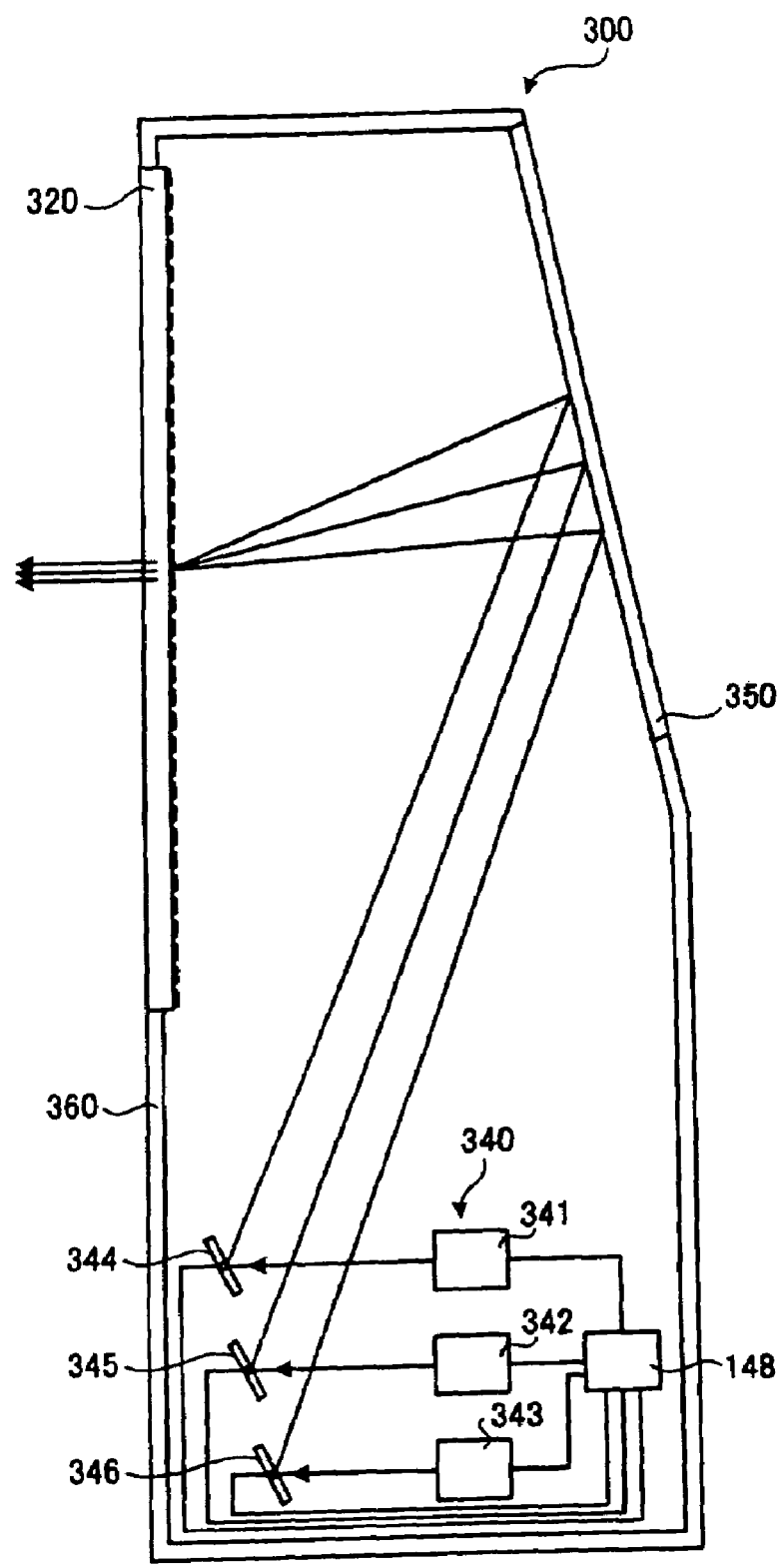
FIG. 3 is a schematic constructional view showing a display apparatus according to Exemplary Embodiment 2 of the present invention.

FIG. 3 is a schematic showing a display apparatus 300 according to Exemplary Embodiment 2 of the present invention. The same signs are assigned to the same portions as in the display apparatus 100 of the foregoing exemplary embodiment 1, and they shall not be repeatedly described. The display apparatus 300 of this exemplary embodiment serves to observe light which is caused to exit from a display panel 320 mounted on a frame 360. An optical system for control lights 340 is accommodated in the frame 360. The display panel 320 features that an organic EL layer forms a structure in which it is divided into a plurality of regions corresponding to pixels.

A first light source portion for control light 341, a second light source portion for control light 342 and a third light source portion for control light 343 generate the first control light L1, second control light L2 and third control light L3, respectively. Besides, the control lights L1, L2 and L3 (shown in FIGS. 3 and 4) are respectively reflected by galvanomirrors 344, 345 and 346, whereupon they proceed toward a mirror 350 which is disposed in opposition to the display panel 320. The individual control lights L1, L2 and L3 having proceeded toward the mirror 350, are reflected by the mirror 350. The reflected lights proceed toward the display panel 320. Since each of the galvanomirrors 344, 345 and 346 turns about two predetermined axes which are substantially orthogonal to each other. Each of the control lights L1, L2 and L3 scans the display panel 320. The individual light source portions for the control lights, 341, 342 and 343, and the individual galvanomirrors 344, 345 and 346 have the same constructions as those of the light source portion for the control light, 142 and the galvanomirror 144 in Exemplary Embodiment 1, respectively. Incidentally, the present invention is not restricted to the construction in which the individual control lights L1, L2 and L3 are respectively allowed to scan by the galvanomirrors 344, 345 and 346, but it may well employ, for example, a construction in which all the control lights L1, L2 and L3 are simultaneously allowed to scan using a single galvanomirror. When all the control lights L1, L2 and L3 are allowed to scan using the single galvanomirror, the turning operations of the plurality of galvanomirrors does not need to be precisely synchronized, and hence, the control of the display panel 320 can be facilitated.

Figure 4:
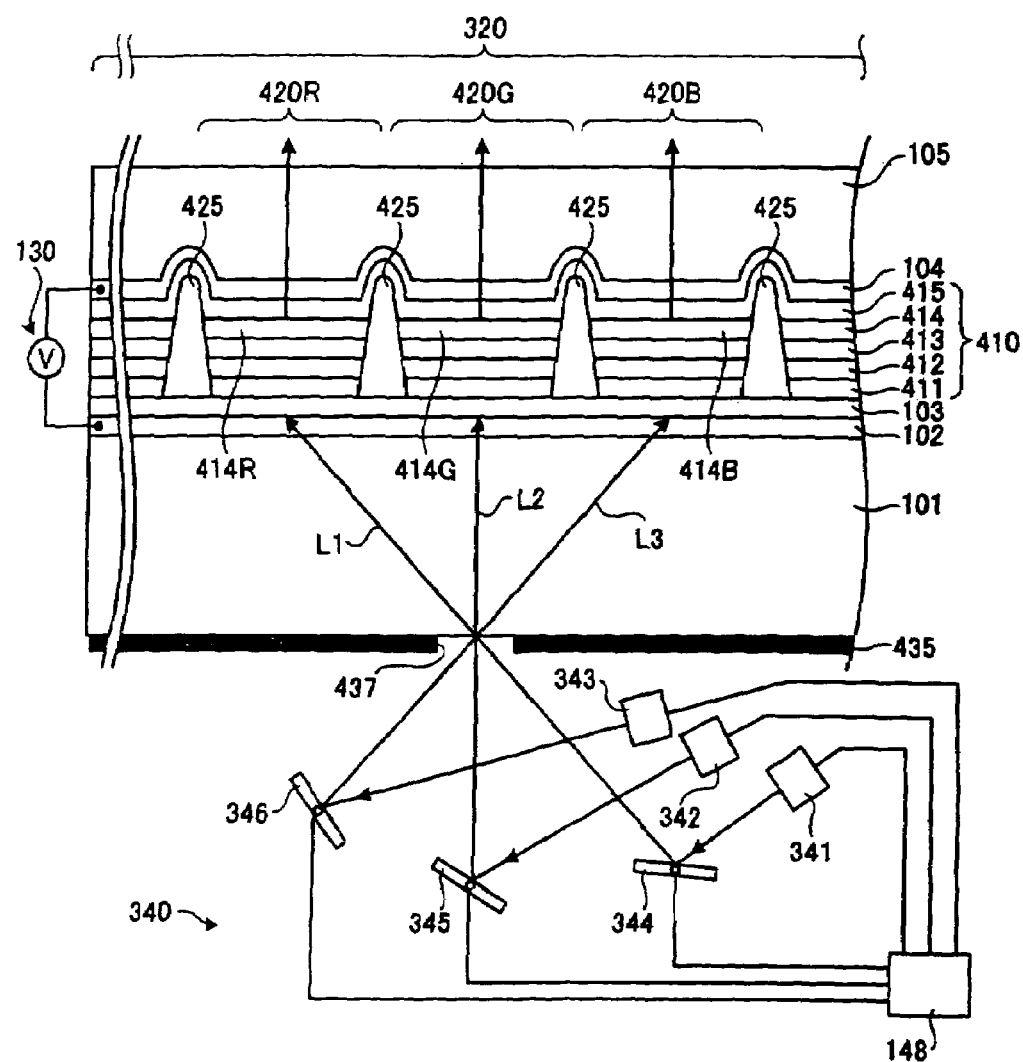
FIG. 4 is a schematic constructional view showing a display panel and an optical system for control lights.

FIG. 4 is a schematic showing the display panel 320 and the optical system for the control lights 340. Here, the construction in which the individual control lights L1, L2 and L3 are reflected by the mirror 350 is omitted from illustration in order to concisely explain the relationship between the display panel 320 and the optical system for the control lights, 340. The display panel 320 is disposed with the side of the substrate 101 facing to the interior of the frame 360 (refer to FIG. 3) and with the protective layer 105 facing to the exterior of the frame 360. A plurality of banks 425 are partition members disposed on the conductivity-variable layer 103 of the display panel 320. Each of the banks 425 is an electrical insulating member which is provided to be rectilinear in two directions being substantially orthogonal to each other, and on a region in a plane being substantially parallel to the substrate 101. The banks 425 can be formed by subjecting polyimide, for example, to ink jetting or to etching and patterning. When the display panel 320 is cut along a plane being substantially perpendicular to the substrate 101, each of the banks 425 is substantially in the shape of an equilateral triangle as shown in FIG. 4.

On those regions of the conductivity-variable layer 103 which are partitioned by the banks 425, a reflection electrode 411, an ITO film 412, a hole transport layer 413, an organic light emission layer 414 and an electron transport layer 415 are successively stacked by ink jetting. The pixels are defined by the organic EL layer 410 which is divided by the banks 425. The individual pixels are arrayed in the shape of a matrix on the substrate 101. In this manner, the display panel 320 forms the structure in which the organic EL layer 410 is divided into the plurality of regions corresponding to the pixels. Incidentally, the reflection electrode 411, ITO film 412, hole transport layer 413 and electron transport layer 415 have the same constructions as those of the reflection electrode 111, ITO film 112, hole transport layer 113 and electron transport layer 115 in Exemplary Embodiment 1, respectively, except that they are divided into the plurality of regions corresponding to the pixels, by the banks 425.

The display panel 320 is provided with a light shield portion 435 on that surface of the substrate 101 which lies on the side of the optical system for the control lights 340. The light shield portion 435 is formed with openings 437 at its positions through which the control lights L1, L2 and L3 from the optical system for the control lights 340 pass. The light shield portion 435 can be formed into the shape of a film by, for example, performing metal evaporation on the substrate 101. The openings 437 can be formed in such a way that the positions where these openings 437 are to be provided are masked in the metal evaporation of the light shield portion 435. Further, the light shield portion 435 and the openings 437 may well be formed in such a way that a light shield member provided with the openings 437 is bonded to the substrate 101, apart from the employment of the evaporation. Incidentally, the details of the positions of the openings 437 in the light shield portion 435 will be explained later.

The organic light emission layer 414 is provided in a state where it is divided by the banks 425 into an organic light emission layer for R-light 414R which generates the R-light being first color light, an organic light emission layer for G-light 414G which generates the G-light being second color light, and an organic light emission layer for B-light 414B which generates the B-light being third color light. The organic light emission layer for the R-light 414R, the organic light emission layer for the G-light 414G, and the organic light emission layer for the B-light 414B, give rise to fluorescence phenomena similarly to the organic light emission layer 114 in Exemplary Embodiment 1. The organic light emission layer for the R-light 414R, the organic light emission layer for the G-light 414G, and the organic light emission layer for the B-light 414B, emit the lights of different wavelength regions in accordance with energies which are generated when the fluorescent substances of the respective layers revert into their ground states after having been excited. Herein, owing to the emissions of the lights of the different wavelength regions, the organic light emission layer for the R-light 414R, the organic light emission layer for the G-light 414G, and the organic light emission layer for the B-light 414B generate the R-light, G-light and B-light, respectively. A pixel for the R-light 420R which is the pixel for the first color light generates the R-light by the organic light emission layer for the R-light 414R. A pixel for the G-light 420G which is the pixel for the second color light generates the G-light by the organic light emission layer for the G-light 414G. A pixel for the B-light 420B which is the pixel for the third color light, generates the B-light by the organic light emission layer for the B-light 414B. Incidentally, for the brevity of description, FIG. 4 illustrates a construction in which one pixel for the R-light 420R, one pixel for the G-light 420G, and one pixel for the B-light 420B in the display panel 320, are paralleled.

Next, the control of the display panel 320 by the control lights L1, L2 and L3 will be described with reference to FIGS. 4 and 5. As shown in FIG. 4, the optical system for the control lights 340 enters the first control light L1, second control light L2, and third control light L3 into those positions of the first transparent electrode layer 102 which correspond to the pixel for the R-light 420R, the pixel for the G-light 420G, and the pixel for the B-light 420B, respectively. The first control light L1 reflected by the galvanomirror 344 passes through the opening 437, and enters only the part of the first transparent electrode layer 102 corresponding to the pixel for the R-light 420R. The opening 437 is provided at such a position that the first control light L1 reflected by the galvanomirror 344 can be passed through this opening 437 and entered into only the first transparent electrode layer 102. In other words, when the opening 437 is viewed in the proceeding direction of the first control light L1, only the part of the first transparent electrode layer 102 corresponding to the pixel for the R-light 420R, can be confirmed.

In a case where the first control light L1 proceeds toward any part other than the part of the first transparent electrode layer 102 corresponding to the pixel for the R-light 420R, it is intercepted by the light shield portion 435. Owing to the interception by the light shield portion 435, the first control light L1 is reduced or prevented from erroneously entering the pixel for the G-light 420G or the pixel for the B-light 420B.

Likewise to the first control light L1, the second control light L2 and the third control light L3 enter only the parts of the first transparent electrode layer 102 corresponding to the pixel for the G-light 420G and the pixel for the B-light 420B, respectively. Incidentally, the position of the light shield portion 435 is not restricted to the surface of the substrate 101 as long as it is a position at which the respective control lights L1, L2 and L3 can be precisely entered into the corresponding pixels. Insofar as the light shield portion 435 lies in the vicinity of the first transparent electrode 102, it may well be arranged at, for example, a position which has a spatial interval from the substrate 101, or the internal position of the substrate 101 other than the surface thereof.

As shown in FIG. 4, the optical system for the control lights, 340 emits the control lights L1, L2 and L3 toward the display panel 320. Accordingly, the proceeding directions of these control lights may intersect in the vicinity of the opening 437 which is provided in correspondence with the pixels for the color lights, 420R, 420G and 420B, in one set. When the opening 437 and the optical system for the control lights, 340 are arranged in this way, the control lights L1, L2 and L3 can be precisely entered into the pixels for the color lights, 420R, 420G and 420B, respectively. Herein, the first control light L1 is entered into the part of the first transparent electrode layer 102 corresponding to the pixel for the R-light 420R, whereby the organic EL layer for the R-light 414R generates the R-light in a light quantity which corresponds to the light quantity of the first control light L1. In this way, the pixel for the R-light 420R emits the R-light from the surface of the protective layer 105 in accordance with an image signal. The pixel for the G-light 420G and the pixel for the B-light 420B emit the G-light and B-light from the protective layer 105, respectively, similarly to the pixel for the R-light 420R.

Figure 5:
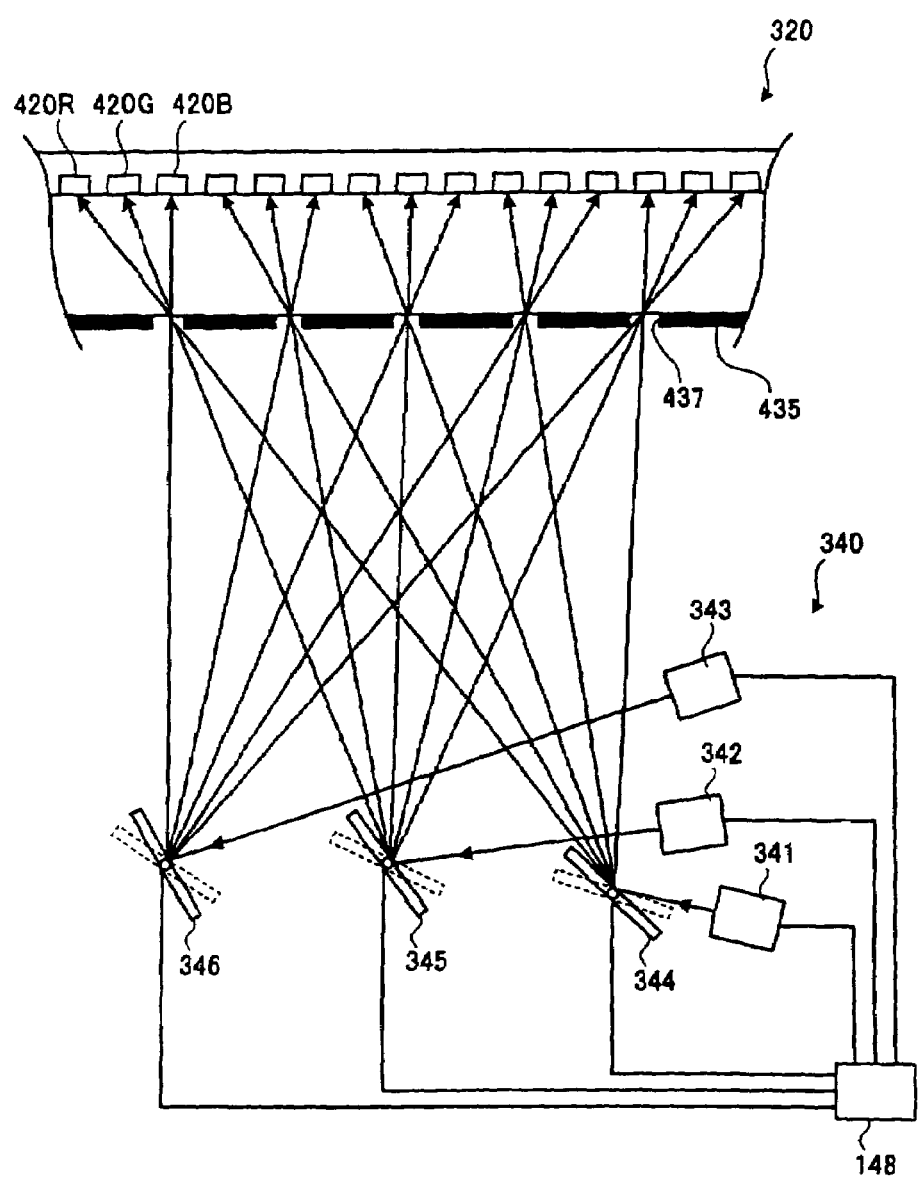
FIG. 5 is a schematic showing the relationship between openings and the optical system for the control lights.

FIG. 5 is a schematic showing a construction in which the control lights L1, L2 and L3 enter pluralities of pixels for the R-light 420R, pixels for the G-light 420G and pixels for the B-light 420B, respectively. Here, among the plurality of pixels of the display panel 320, the pixels for the respective color lights, 420R, 420G and 420B in five sets are illustrated for description. As shown in FIG. 5, the openings 437 are provided in correspondence with the respective sets of pixels for the color lights, 420R, 420G and 420B. The light shield portion 435 is provided with the openings 437, and the control lights L1, L2 and L3 are passed through each of the openings 437. The control lights L1, L2 and L3 pass through each opening 437 from positions different from one another, and they enter those selected parts of the first transparent electrode layer 102 (refer to FIG. 4) which correspond to the pixels for the color lights, 420R, 420G and 420B. In this way, the control lights L1, L2 and L3 can enter only the pixel for the R-light 420R, the pixel for the G-light 420G and the pixel for the B-light 420B, respectively. Incidentally, the display panel 320 is not restricted to the construction in which one opening 437 is provided for one set of pixels for the color lights, 420R, 420G and 420B. Insofar as the control lights L1–L3 can be precisely entered into the respective pixels for the color lights, 420R, 420G and 420B, the positions and number of the openings 437 for the pixels are appropriately alterable.

With, for example, a construction in which the light shield portion 435 is not provided, the optical system for the control lights 340 must enter the control lights L1, L2 and L3 precisely in correspondence with only the positions of the respective pixels for the color lights, 420R, 420G and 420B. In contrast, with the construction in which the openings 437 are provided in the light shield portion 435, the optical system for the control lights, 340 can be used for the display apparatus 300 as long as it can enter the control lights L1, L2 and L3 into the openings 437 provided in correspondence with the pixels 420R, 420G and 420B for the color lights. Thus, the optical system for the control lights, 340 need not enter the control lights L1, L2 and L3 at a high precision up to the level of the positions of the individual pixels, but it may enter the control lights L1, L2 and L3 at a precision up to the level of the positions of the individual openings 437. The control lights L1, L2 and L3 can also be modulated and allowed to scan in accordance with the image signal in their irradiating states left intact.

In this manner, the control of the display panel 320 is facilitated owing to the facts that the order of the entrance position level of the control lights L1, L2 and L3 from the optical system for the control lights, 340 becomes large, and that the control lights L1, L2 and L3 are modulated in accordance with the image signal with their irradiating states left intact. Moreover, even when the scanning speed of the control lights L1, L2 and L3 is not lowered, light addressing can be performed precisely. Therefore, even when the control lights L1, L2 and L3 are allowed to scan at a speed necessary for displaying an image of high quality, the control lights L1, L2 and L3 can be precisely entered into the respective pixels for the color lights, 420R, 420G and 420B. Further, a precise control can be easily performed even for a large-sized display panel 320. This brings forth the advantage that the precise control can be easily performed without degrading the quality of an image.

Unlike the case of employing an electron beam, the control lights L1, L2 and L3 can have their proceeding directions deflected by the mirror 350 as in the display apparatus 300, and they can be fined by lenses. When the proceeding directions of the control lights L1, L2 and L3 can be bent by the mirror 350, the control lights L1, L2 and L3 can scan over the whole large-sized display panel 320 even in the case of the thinned structure of the display apparatus 300. In a case where the mirror 350 is not disposed, the optical system for the control lights, 340 needs to be disposed at a position which is substantially perpendicular to the entrance surface of the display panel 320. With the construction in which the control lights L1, L2 and L3 are deflected by the mirror 350 so as to enter the display panel 320, the optical system for the control lights, 340 need not be disposed at the position being substantially perpendicular to the entrance surface of the display panel, and it can be arranged at any position inside the frame 360. Therefore, the frame 360 can be thinned.

Further, when the control lights L1, L2 and L3 are deflected by the mirror 350, optical paths from the respective galvanomirrors 344, 345 and 346 to substantially the central part of the entrance surface of the display panel 320 can be made longer. Owing to the longer optical paths to the display panel 320, scanning angles based on the galvanomirrors 344, 345 and 346 can be made narrower with the size of the frame 360 kept small. Therefore, the control lights L1, L2 and L3 can be easily allowed to scan over the whole entrance surface of the display panel 320. Especially, even for the large-sized display panel 320, the control lights L1, L2 and L3 can be easily allowed to scan. This brings forth the advantage that the display panel 320 can be easily enlarged in size.

Figures 1, 6:
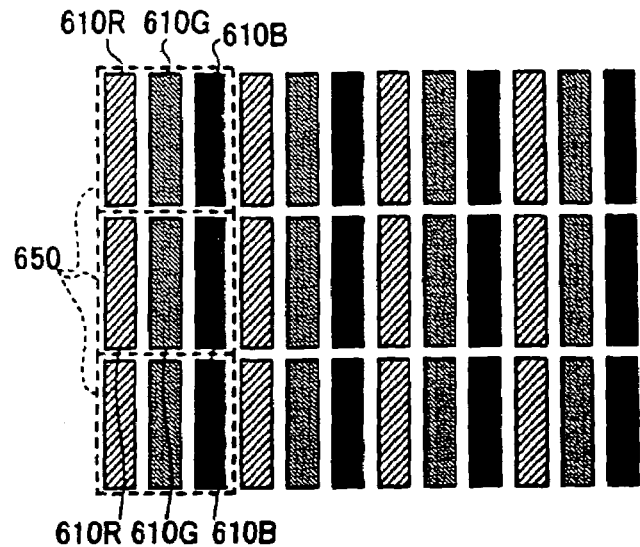
Figures 2, 6:
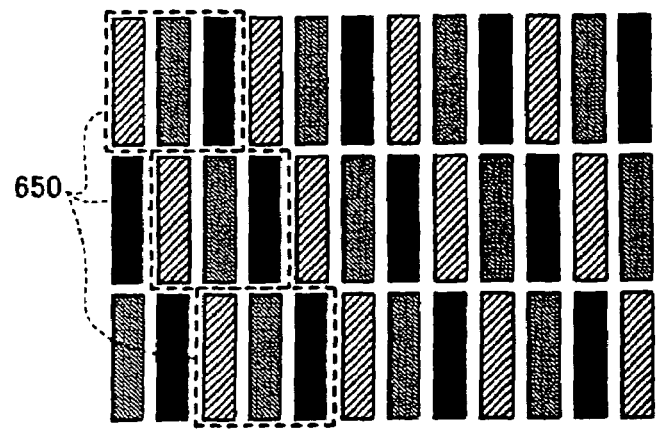
Figures 3, 6:
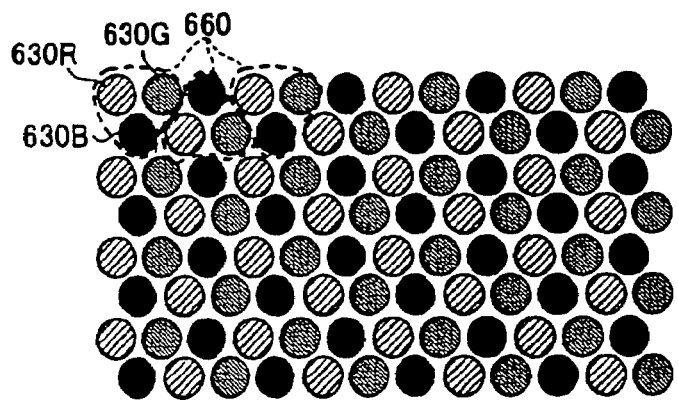
Figures 1, 7:
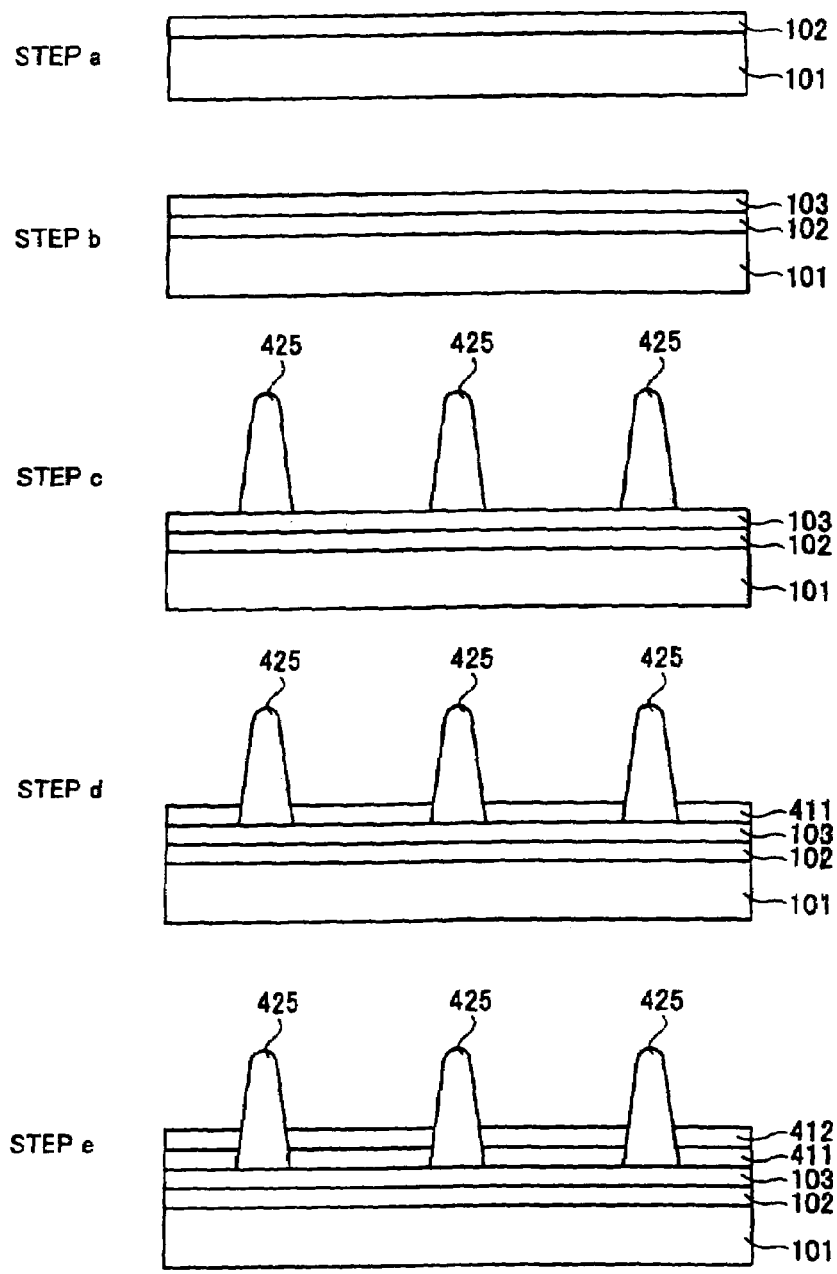
Figures 2, 7:
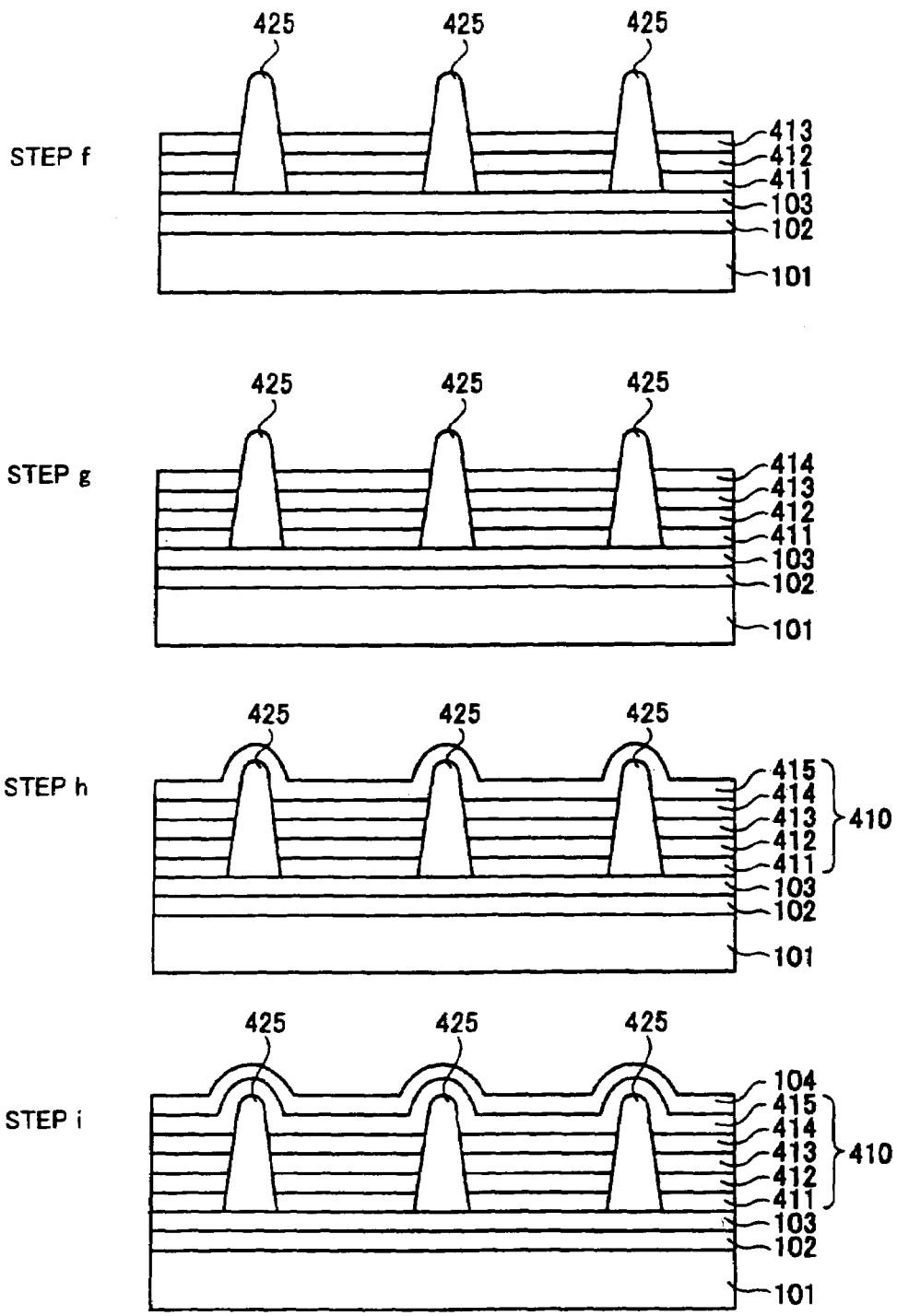
Figures 3, 7:
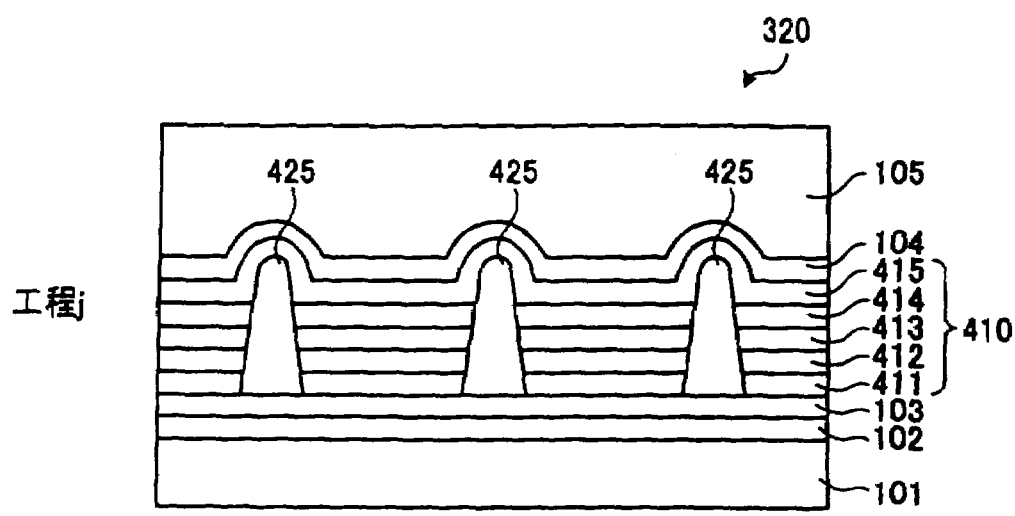
Figures 1, 8:
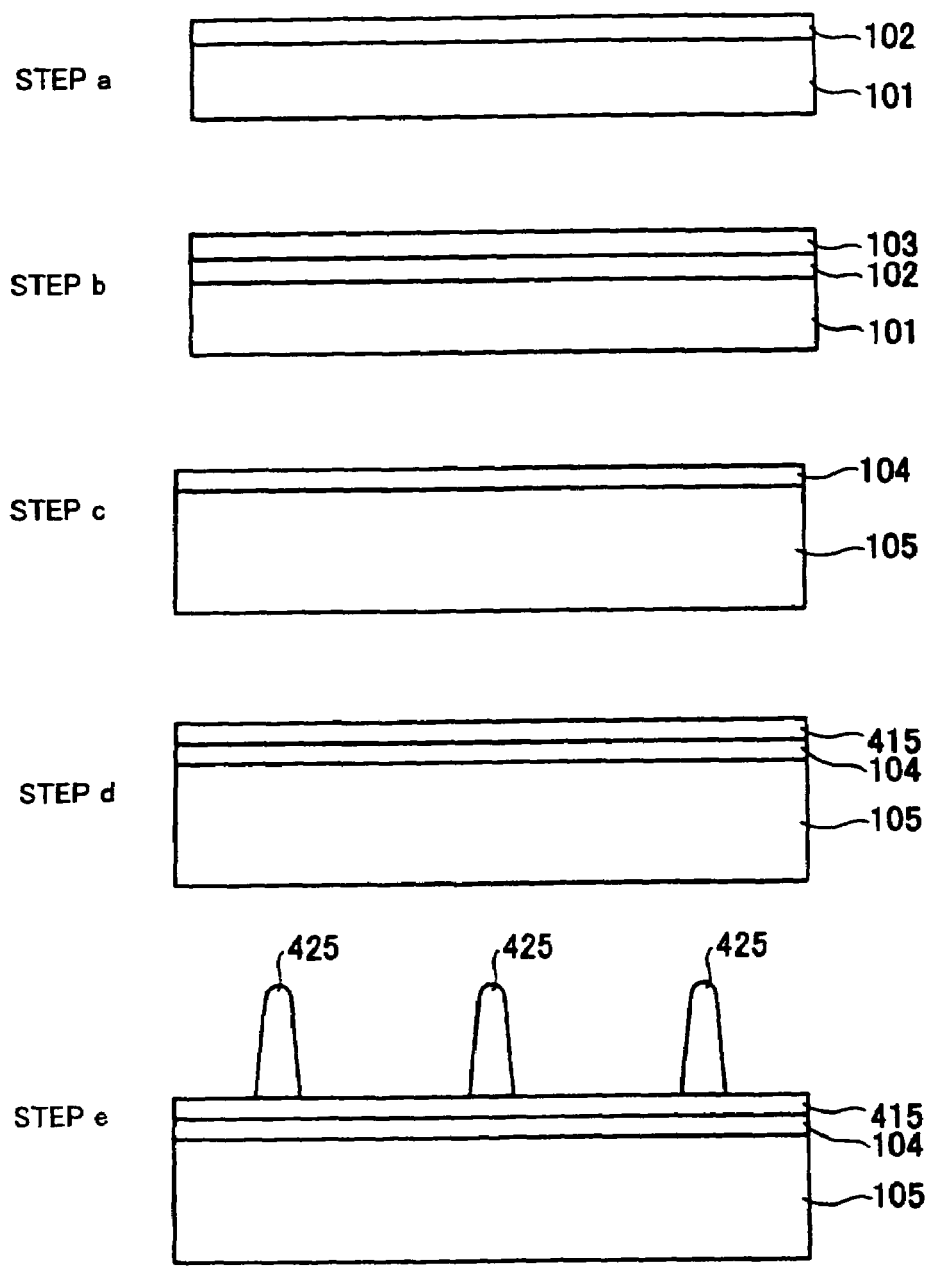
Figures 2, 8:
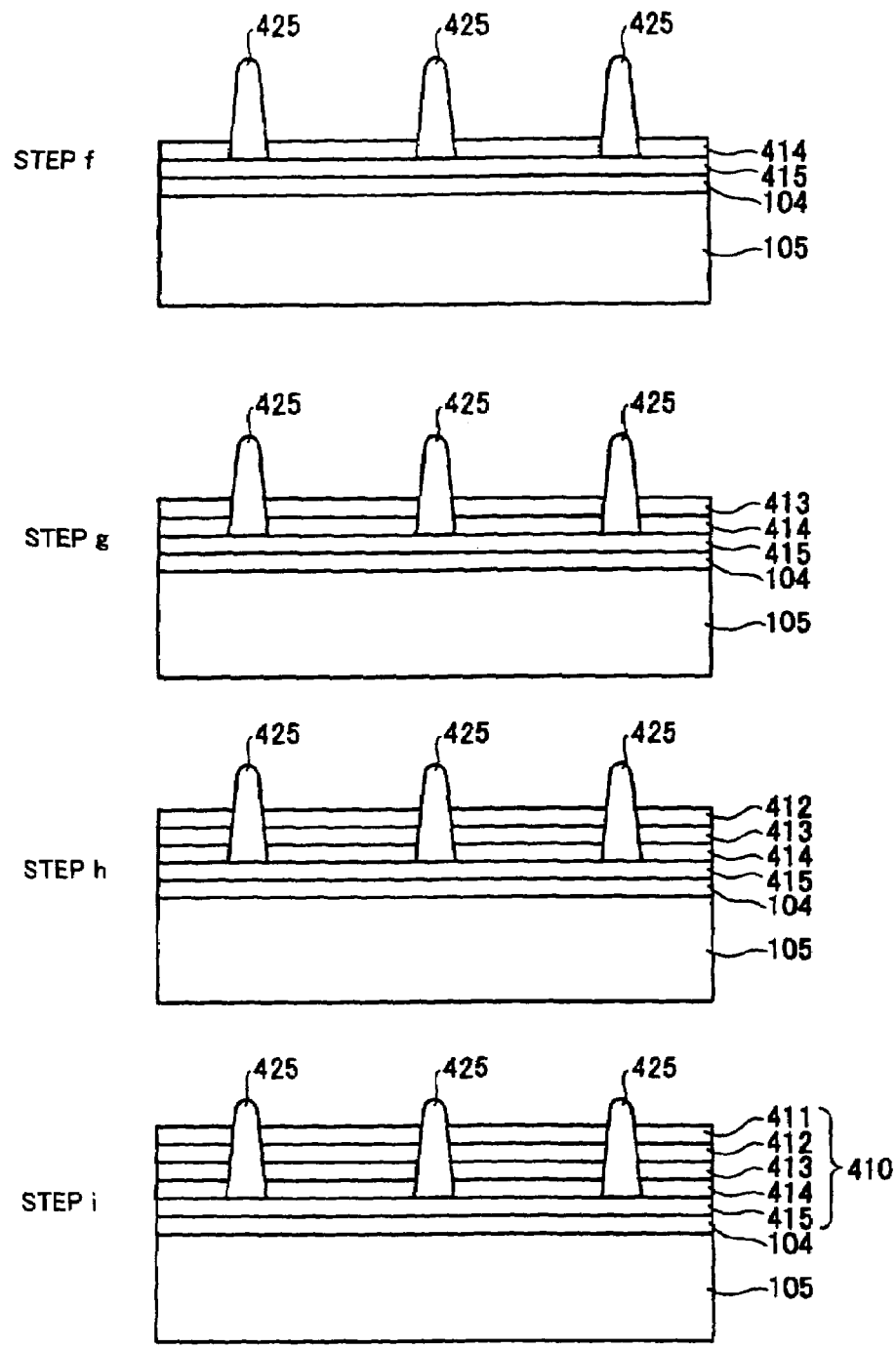
Figure 8:
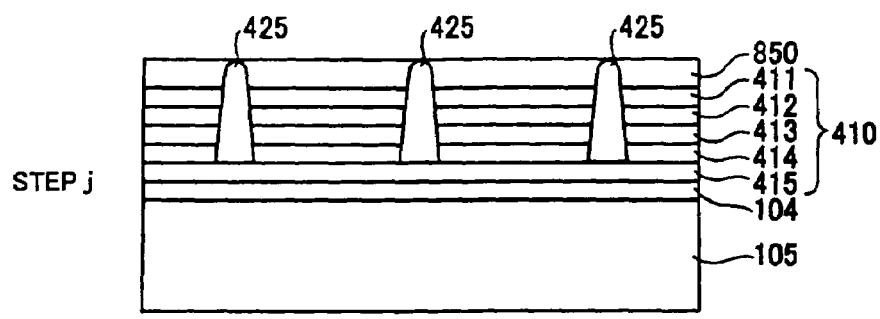
Figure 3:
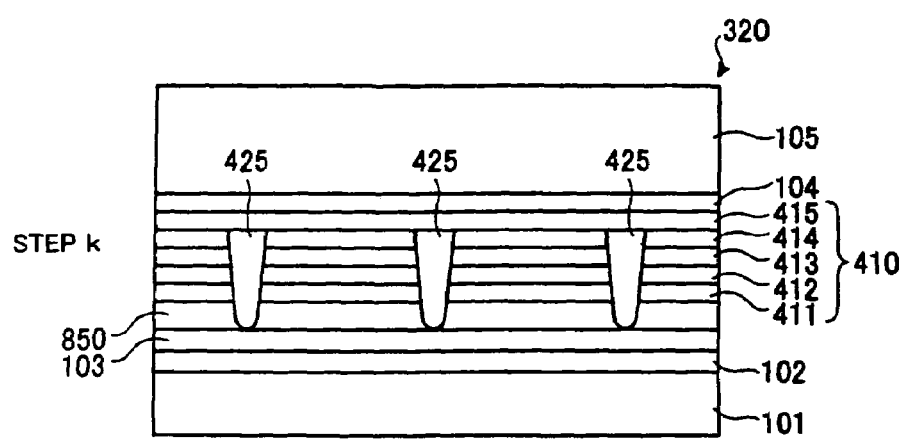

Next, the layout of the pixels for the R-light 420R, the pixels for the G-light 420G, and the pixels for the B-light 420B will be described with reference to FIGS. 6-1, 6-2 and 6-3. FIGS. 6-1, 6-2 and 6-3 show the array of the individual pixels with the display panel 320 (refer to FIG. 4) viewed from the side of the protective layer 105. FIG. 6-1 shows an example in which a pixel for the R-light 610R, a pixel for the G-light 610G, and a pixel for the B-light 610B, each being in a rectangular shapes that are arrayed substantially in the shape of a regular square. The pixels for the R-light 610R, the pixels for the G-light 610G and the pixels for the B-light 610B constitute pixel aggregates 650 each of which is substantially in the shape of the regular square. Besides, the plurality of pixel aggregates 650 are laid out at substantially equal intervals in the predetermined two-dimensional directions of a surface which is substantially parallel to the substrate 101 (refer to FIG. 4).

Since the individual pixels are arrayed so as to constitute the pixel aggregates 650 each being substantially in the shape of the regular square, they can be densely arrayed. When the pixels are densely arrayed, the aperture percentage of the display panel 320 is enhanced, and a bright image can be obtained. Further, the pixel aggregates 650 are shaped substantially into the regular squares and are arrayed at the substantially equal intervals in the two-dimensional directions, whereby the distortion of an image is reduced, and the image can be displayed in precise correspondence with an image signal. This brings forth the advantage that a full-color image can be displayed brightly and precisely. Besides, as shown in FIG. 6-2, the array of the individual pixels and the layout of the pixel aggregates 650 as shown in FIG. 6-1 may well be shifted by one pixel. Further, as shown in FIG. 6-3, each of pixels can be made circular, whereupon the individual pixels are arrayed so as to constitute pixel aggregates 660 each being substantially in the shape of a regular triangle. The pixel aggregates 660 are arrayed by alternately changing their directions, whereby the pixels can be densely arrayed as in the array of the pixels shown in FIG. 6-1. Therefore, a full-color image can be displayed brightly and precisely.

Next, a first manufacturing method and a second manufacturing method for the display panel 320 of this exemplary embodiment will be described. FIGS. 7-1, 7-2 and 7-3 show the procedure of the first manufacturing method for the display panel 320. First, at a step a which is a first-transparent-electrode-layer formation step, a first transparent electrode layer 102 is formed on a substrate 101. Subsequently, at a step b which is a conductivity-variable-layer formation step, a conductivity-variable layer 103 is formed on the first transparent electrode layer 102 formed at the step a. The first transparent electrode layer 102 and the conductivity-variable layer 103 can be formed by forming films uniformly over the whole substrate 101, respectively. Subsequently, at a step c which is a partition-member formation step, banks 425 are formed in a predetermined pattern on the conductivity-variable layer 103 formed at the step b. The banks 425 can be formed by performing, for example, ink jetting, or etching and patterning. Individual pixels on the display panel 320 can be constructed by the partitions of the banks 425. Therefore, the pattern of the banks 425 can be altered in accordance with the shape of each pixel.

Next, at an EL-layer formation step, an organic EL layer 410 is formed among the banks 425 formed at the step c. At the EL-layer formation step, a reflection electrode 411 is first provided at a step d. The reflection electrode 411 can be formed by evaporating a metal such as aluminum. Subsequently, the reflection electrode 411 provided at the step d is overlaid with an ITO film 412 at a step e, a hole transport layer 413 at a step f and an organic light emission layer 414 at a step g in succession. The respective layers of the reflection electrode 411, ITO film 412, hole transport layer 413 and organic light emission layer 414 can be stacked by employing ink-jet technology. Especially, at the step g, organic light emission layers for R-light 414R, organic light emission layers for G-light 414G, and organic light emission layers for B-light 414B (refer to FIG. 4) can be formed selectively at desired positions by the ink-jet technology. Besides, at a step h, an electron transport layer 415 is formed on the banks 425 formed at the step c, and on the organic light emission layer 414 formed at the step g. In this way, the organic EL layer 410 is formed at the steps d–h.

The respective layers of the reflection electrode 411, ITO film 412, hole transport layer 413 and organic light emission layer 414 may well be fabricated by print technology based on transfer, a photo process, or the like without resorting to the ink jetting. Byway of example, a hole transport layer 413, an organic light emission layer 414, etc. which are patterned can alternatively be stacked by metal evaporations. It is also allowed that a pattern which is inversely tapered in correspondence with pixels, is prepared on the conductivity-variable layer 103 which is formed uniformly, whereupon the respective layers of the organic EL layer 410 are uniformly formed on inversely-tapered resist portions. The respective layers formed on the inversely-tapered resist portions become a structure in which they are electrically isolated every resist portion, so that the organic EL layer 410 can be provided in correspondence with the respective pixels without disposing the banks 425.

Subsequently, at a step i which is a second-transparent-electrode-layer formation step, a second transparent electrode layer 104 is formed on the electron transport layer 415 formed at the step h. The electron transport layer 415 at the step h and the second transparent electrode layer 104 at the step i can be formed by forming films uniformly over the whole surface of the substrate 101. Lastly, at a step j which is a protective-layer formation step, the upper surface of the second transparent electrode layer 104 formed at the step i is sealed by a protective layer 105. In the above way, the display panel 320 of this exemplary embodiment can be manufactured. Besides, the display panel 320 dispenses with TFT elements. Since the TFTs are dispensed with, the layers of the parts except the banks 425 for constructing the pixels, and the organic EL layer 410 provided in correspondence with the pixels, can be formed by forming the films over the whole surface of the substrate 101. Therefore, the display panel 320 can be manufactured with ease.

FIGS. 8-1, 8-2 and 8-3 show the procedure of the second manufacturing method for the display panel 320.

The second exemplary manufacturing method for the display panel 320 differs from the first exemplary manufacturing method in the point that a first layered structure and a second layered structure are fabricated as separate members, and that they are thereafter stuck to each other. The first layered structure is constructed of a substrate 101 being a first substrate, a first transparent electrode layer 102, and a conductivity-variable layer 103. First, at a first-layered-structure formation step which consists of a step a and a step b, the first layered structure constructed of the substrate 101, first transparent electrode layer 102 and conductivity-variable layer 103 is formed. The step a being a first-transparent-electrode-layer formation step, and the step b being a conductivity-variable-layer formation layer are respectively the same as the step a and step b of the first manufacturing method stated before. At the first-layered-structure formation step, the respective layers can be formed uniformly over the whole surface of the substrate 101.

Subsequently, at a second-layered-structure formation step which consists of a step c-a step i, there is formed the second layered structure which is constructed of a protective layer 105 being a second substrate, a second transparent electrode layer 104, banks 425 being partition members, and an organic EL layer 410. At the second-layered-structure formation step, respective layers are stacked successively from the protective layer 105, reversely to the step d-the step j in the procedure of the first manufacturing method. At the step c which is a second-transparent-electrode-layer formation step, the second transparent electrode layer 104 is formed on the protective layer 105. Likewise to the substrate 101, the protective layer 105 is a parallel flat plate which is made of an optically transparent member. Besides, at the step d, an electron transport layer 415 is provided on the second transparent electrode layer 104 formed at the step c. The second transparent electrode layer 104 at the step c, and the electron transport layer 415 at the step d can be formed uniformly over the whole surface of the protective layer 105.

Subsequently, at the step e which is a partition-member formation step, the banks 425 are provided in a predetermined pattern on the electron transport layer 415 provided at the step d. The formation of the banks 425 is the same as that in the first exemplary manufacturing method. Besides, at the step f-the step i which constitute an EL-layer formation step, an organic light emission layer 414, a hole transport layer 413, an ITO film 412 and a reflection electrode 411 are successively, stacked among the banks 425 formed at the step e. In this way, the organic EL layer 410 is constructed of the electron transport layer 415 which has been formed at the step d, and the organic light emission layer 414, hole transport layer 413, ITO film 412 and reflection electrode 411 which have been formed at the step f-the step i. At the second-layered-structure formation step, the respective layers of the organic EL layer 410 are stacked successively from the side of the protective layer 105.

Excepting that the stacking sequence of the respective layers is reversed, the details of the stacking of the respective layers of the organic EL layer 410 are the same as the procedure at the steps d–j of the first manufacturing method. In this way, the second layered structure corresponding to pixels can be formed at the second-layered-structure formation step.

Subsequently, at a step j, a bonding layer 850 being electrically conductive is provided on the reflection electrode 411 formed at the step i. Besides, at a step k which is a sticking step, the second layered structure formed at the second-layered-structure formation step is stuck onto the first layered structure formed at the first-layered-structure formation step, into a unitary structure as the display panel 320. On this occasion, the first and second layered structures are stuck together so that the conductivity-variable layer 103 of the first layered structure, and the banks 425 as well as the bonding layer 850 of the second layered structure may be placed on each other. When the bonding layer 850 has intruded between the bank 425 and the conductivity-variable layer 103 at the step k, the parts of the reflection electrode 411 corresponding to the adjacent pixels are electrically connected with each other by the bonding layer 850 having intruded. When the parts of the reflection electrode 411 corresponding to the adjacent pixels are electrically connected with each other, it becomes difficult to control the drive of the display panel 320 in accordance with an image signal. At the step k, the bonding layer 850 needs to be prevented from intruding between the banks 425 and the conductivity-variable layer 103. Further, at the step j, the bonding layer 850 should desirably be provided on only regions surrounded with the banks 425, by employing ink jetting. In this way, the bonding layer 850 is reduced or prevented from intruding between the banks 425 and the conductivity-variable layer 103, and the display panel 320 which can be precisely controlled in accordance with the image signal, is obtained.

In a case where an organic EL display is provided with TFT elements, it needs to be manufactured so that the positions of the electrodes of the TFT elements may be registered with the positions of the parts of an organic EL layer corresponding to pixels. In contrast, the display panel 320 dispenses with the TFT elements. The organic EL layer 410 need not have its positions registered as in the case of providing the TFT elements, but it may well be constructed in correspondence with the pixels, on the conductivity-variable layer 103 formed over the whole surface of the substrate 101. Therefore, the first layered structure which can be formed over the whole surface of the substrate 101, and the second layered structure which structurally corresponds to the pixels can be respectively formed as the separate members. Besides, the first layered structure and the second layered structure are stuck together into the unitary structure, whereby the display panel 320 can be manufactured.

When the second layered structure is formable as the member separate from the first layered structure, it can be formed by successively stacking the second transparent electrode layer 104 and the organic EL layer 410 on the protective layer 105. When the second layered structure can be formed by successively stacking the respective layers on the protective layer 105, the protective layer 105 can be made a more rigid member than in the case of forming the protective layer 105 on a layered structure corresponding to pixels. Therefore, this exemplary manufacturing method brings forth the advantage that the protective layer 105 of the display panel 320 can be made rigid, so the manufactured display panel 320 can be used for a long term. Incidentally, a method in which a plurality of unitized display panels are arrayed in the shape of tiles may well be adopted as a method of manufacturing a large-sized display panel 320. Thus, the display panel 320 of large size and high definition can be manufactured with ease.

Exemplary Embodiment 3

Figure 9:
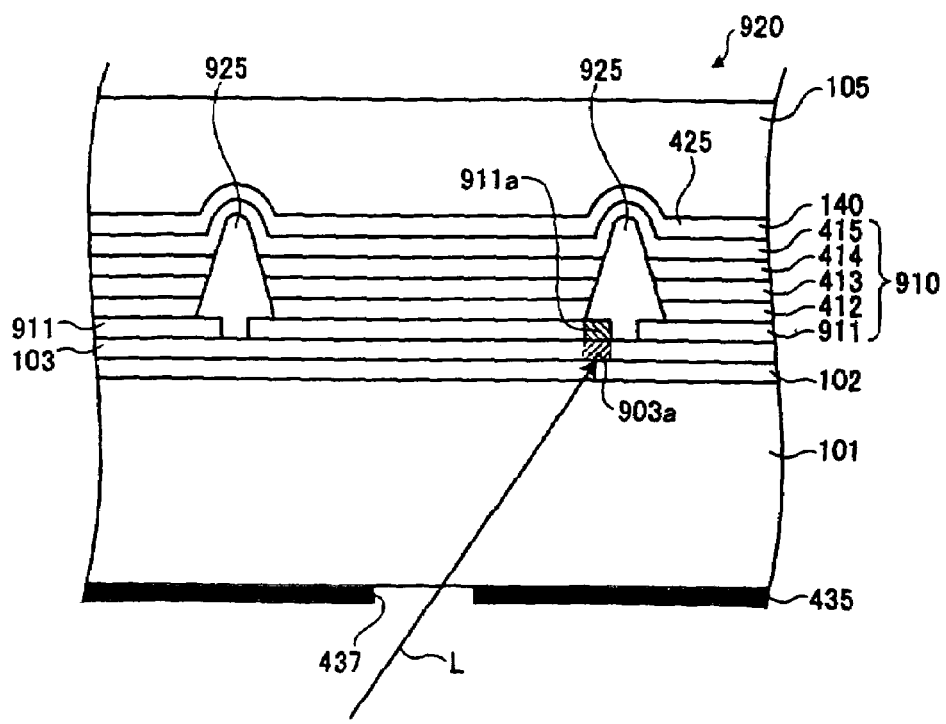
FIG. 9 is a schematic constructional view showing a display panel according to Exemplary Embodiment 3 of the present invention.

FIG. 9 is a schematic showing a display panel 920 according to Exemplary Embodiment 3 of the present invention. The same signs are assigned to the same portions as in the display apparatus 300 of the foregoing exemplary embodiment 2, and they shall not be repeatedly described. The display panel 920 in this exemplary embodiment features that the region of a reflection electrode 911 corresponding to each pixel is larger than the region of the part of an organic EL layer 910 as is partitioned by banks 925. The organic EL layer 910, is constructed of the reflection electrode 911, an ITO film 412, a hole transport layer 413, an organic light emission layer 414 and an electron transport layer 415. Similar to the reflection electrode 111 in Exemplary Embodiment 1, the reflection electrode 911 can be constructed by evaporating a metal, for example, aluminum (Al). Likewise to the bank 425 in Exemplary Embodiment 2, the bank 925 is an electrical insulating member which is provided to be rectilinear in two directions being substantially orthogonal to each other, and on a region in a plane being substantially parallel to the substrate 101. The banks 925 can be formed by subjecting polyimide, for example, to ink jetting or to etching and patterning.

When the display panel 920 is cut along a plane being substantially perpendicular to a substrate 101, each of the banks 925 has such a shape that, as shown in FIG. 9, the peripheral parts 911a of the reflection electrode 911 lie in two places near the base of a substantially equilateral-triangular shape. The ITO film 412, hole transport layer 413, organic light emission layer 414 and electron transport layer 415 which are the portions of the organic EL layer 910 other than the reflection electrode 911, are divided into regions corresponding to a plurality of pixels by the parts of the slanting surfaces of the banks 925 in the substantially equilateral-triangular shape. In contrast, the reflection electrode 911 is provided so that the peripheral parts 911a thereof may be held between the banks 925 and the regions 903a of a conductivity-variable layer 103. Therefore, when the reflection electrode 911 is viewed from the side of a protective layer 105, it has the region which is larger than the region of the organic EL layer 910 divided by the slanting surface parts of the banks 925.

It is assumed by way of example, that control light L has entered the region 903a of the conductivity-variable layer 103, as shown in FIG. 9. Supposing that the region of the bank 925 occupies the position of the peripheral part 911a, a voltage cannot be sufficiently applied to the reflection electrode 911 even in a case where the conductivity of the region 903a has been changed by the control light L. Therefore, the control light L cannot satisfactorily contribute to the drive of the display panel 920. In contrast, since the region of the reflection electrode 911 is made larger in correspondence with the region of the peripheral part 911a, the voltage can be sufficiently applied to the reflection electrode 911 in the case where the conductivity of the region 903a has been changed by the control light L. Accordingly, the control light L having entered the region 903a can satisfactorily contribute to the drive of the display panel 920.

In this manner, the region of the reflection electrode 911 provided in correspondence with each pixel is enlarged, whereby the control light L having entered a larger area than in the case where the reflection electrode 911 is divided into the region of the same size as that of the region of the organic EL layer 910, can be utilized. Accordingly, utilization efficiency of the control light L is enhanced. Besides, since the control light L having entered the larger area can be utilized, the control of the display panel 920 can be satisfactorily performed even when the entrance position of the control light L is difficult to be controlled at a high precision.

This brings forth the advantage that the organic EL layer 910 can efficiently emit light.

Incidentally, when the parts of the reflection electrode 911 corresponding to the adjacent pixels come into touch with each other, they are electrically connected with each other. When the parts of the reflection electrode 911 are electrically connected with each other, the organic light emission layer 414 becomes difficult to emit light in accordance with an image on a pixel basis. Therefore, the size of each region of the reflection electrode 911 needs to be to the extent that the parts of the reflection electrode 911 corresponding to the adjacent pixels do not come into touch with each other. Each bank 925 is located in the space between the adjacent parts of the reflection electrode 911 as in this exemplary embodiment, whereby the parts of the reflection electrode 911 corresponding to the adjacent pixels can be reduced or prevented from being electrically connected with each other. Thus, the display panel 920 can be precisely controlled in accordance with the image signal.

Exemplary Embodiment 4

Figure 10:
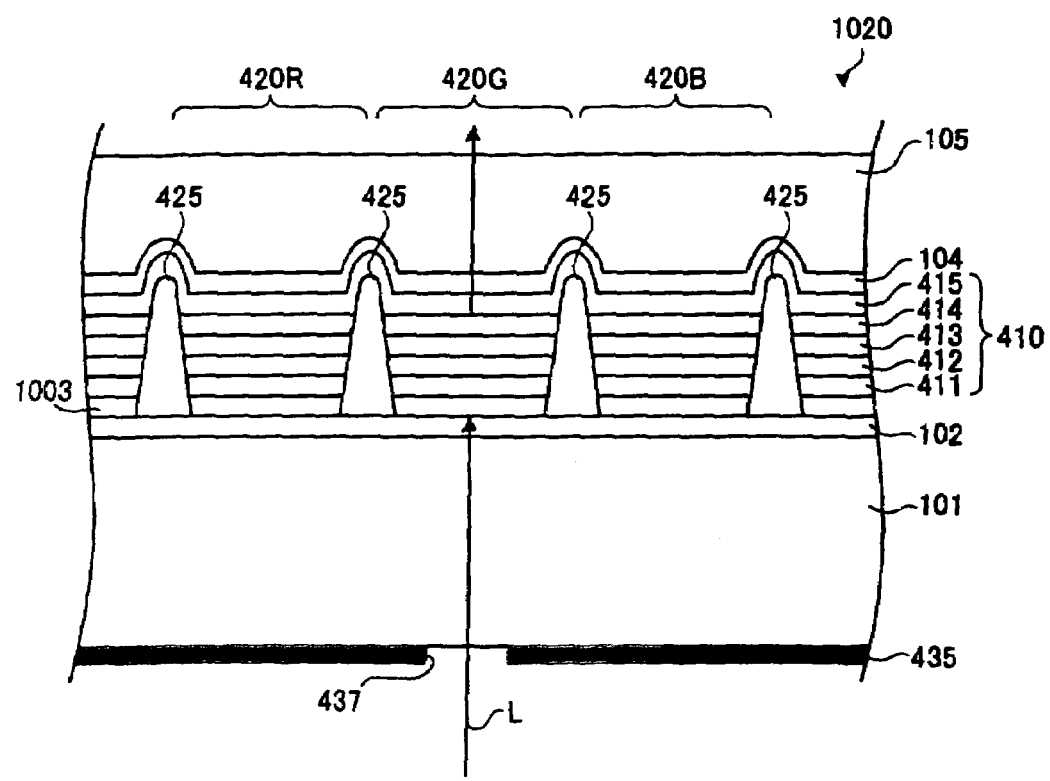
FIG. 10 is a schematic constructional view showing a display panel according to Exemplary Embodiment 4 of the present invention.

FIG. 10 is a schematic showing a display panel 1020 according to Exemplary Embodiment 4 of the present invention. The same signs are assigned to the same portions as in the display apparatus 300 of the foregoing exemplary embodiment 2, and they shall not be repeatedly described. The display panel 1020 features a conductivity-variable layer 1003 having a structure in which it is divided into a plurality of regions corresponding to pixels. The details of this exemplary embodiment are the same as in the foregoing exemplary embodiment 2 except the point that, likewise to an organic EL layer 410, the conductivity-variable layer 1003 is divided in correspondence with the pixels by banks 425. A manufacturing method for the display panel 1020 is the same as the manufacturing method for the foregoing display panel 320 except the point that the banks 425 are provided on a first transparent electrode layer 102, whereupon the conductivity-variable layer 1003 is stacked on the first transparent electrode layer 102 partitioned by the banks.

The conductivity-variable layer 1003 tends to spread a region where its conductivity changes, to the surroundings around the irradiation position of control light L in proportion to the intensity of the control light L and the irradiation time period thereof. Likewise to the organic EL layer 410, the conductivity-variable layer 1003 is divided into the plurality of regions in correspondence with the pixels, whereby the parts of an organic light emission layer 414 corresponding to predetermined pixels can precisely emit light by the control light L. Moreover, even when it is difficult to control the entrance position of the control light L at a high precision, the display panel 1020 can be satisfactorily controlled. This brings forth the advantage that the drive of the display panel 1020 can be precisely controlled.

Exemplary Embodiment 5

Figure 11:
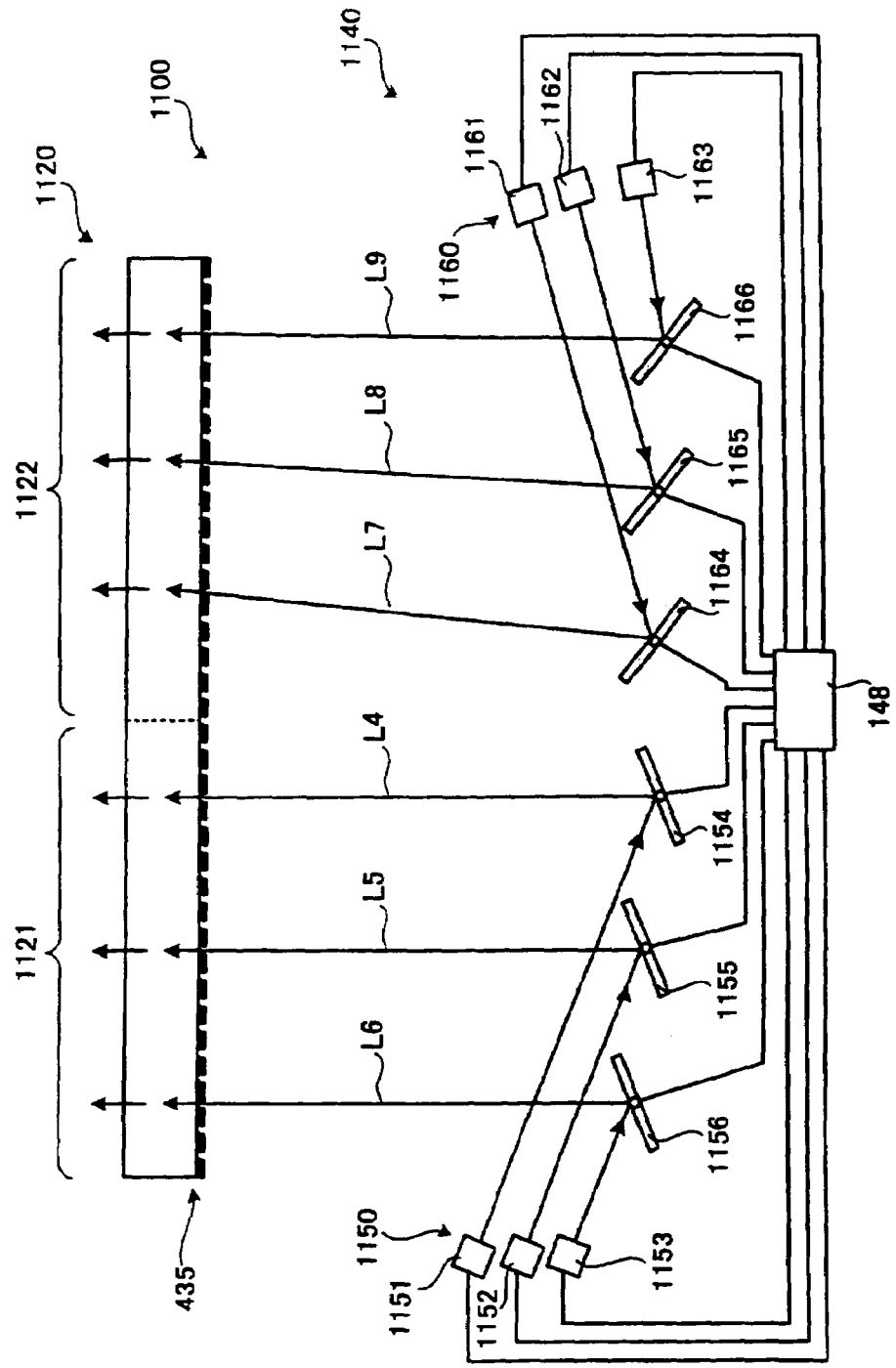
FIG. 11 is a schematic constructional view showing a display apparatus according to Exemplary Embodiment 5 of the present invention.

FIG. 11 is a schematic showing a display apparatus 1100 according to Exemplary Embodiment 5 of the present invention. The same signs are assigned to the same portions as in the display apparatus 300 of the foregoing exemplary embodiment 2, and they shall not be repeatedly described. An optical system for control lights, 1140 in the display apparatus 1100 features that it has two light source units for the control lights, 1150 and 1160. The light source unit for the control lights, 1150 includes a first light source portion for the control light 1151, a second light source portion for the control light 1152 and a third light source portion for the control light 1153. The first light source portion for the control light 1151 supplies first control light L4 to the part of a first transparent electrode layer 102 (refer to FIG. 4) corresponding to a pixel for R-light 420R. The second light source portion for the control light 1152 supplies second control light L5 to the part of the first transparent electrode layer 102 (refer to FIG. 4) corresponding to a pixel for G-light 420G. The third light source portion for the control light 1153 supplies third control light L6 to the part of the first transparent electrode layer 102 (refer to FIG. 4) corresponding to a pixel for B-light 420B. The control lights LA, L5 and L6 scan the first region 1121 of a display panel 1120 by galvanomirrors 1154, 1155 and 1156 which are disposed in correspondence with the light source portions for the respective control lights 1151, 1152 and 1153.

The light source unit for the control lights 1160 includes a first light source portion for the control light 1161, a second light source portion for the control light 1162 and a third light source portion for the control light 1163. The first light source portion for the control light 1161 supplies first control light L7 to the part of the first transparent electrode layer 102 (refer to FIG. 4) corresponding to a pixel for R-light 420R. The second light source portion for the control light 1162 supplies second control light L8 to the part of the first transparent electrode layer 102 (refer to FIG. 4) corresponding to a pixel for G-light 420G. The third light source portion for the control light 1163 supplies third control light L9 to the part of the first transparent electrode layer 102 (refer to FIG. 4) corresponding to a pixel for Blight 420B. The control lights L7, L8 and L9 scan the second region 1122 of the display panel 1120 by galvanomirrors 1164, 1165 and 1166 which are disposed in correspondence with the light source portions for the respective control lights 1161, 1162 and 1163. In this manner, the light source units for the control lights 1150 and 1160 supply the control lights L4–L6 and L7–L9 to the first region 1121 and second region 1122 being the different regions of the display panel 1120, respectively.

The light source units for the control lights, 1150 and 1160 supply the respective control lights L4–L6 and L7–L9 while taking charge of the different regions of the display panel 1120. It is therefore possible to shorten distances from the individual galvanomirrors 1154, 1155, 1156, 1164, 1165 and 1166 to the display panel 1120. Moreover, since the light source units supply the control lights L4–L9 while taking charge of the different regions of the display panel 1120, the scanning angles of these control lights L4–L9 can be narrowed. Since the scanning distances of the control lights L4–L9 are shortened, an image can be satisfactorily displayed even when the scanning speeds of the control lights L4–L9 are lowered. This brings forth the advantages that the display apparatus 1100 can be made small in size, and that the control lights L4–L9 can be allowed to scan with ease. Incidentally, although the display apparatus 1100 of this exemplary embodiment employs the two light source units for the control lights 1150 and 1160, control lights may well be supplied by disposing three or more light source units for the control lights and dividing the display panel 1120 into three or more regions.

Figure 12:
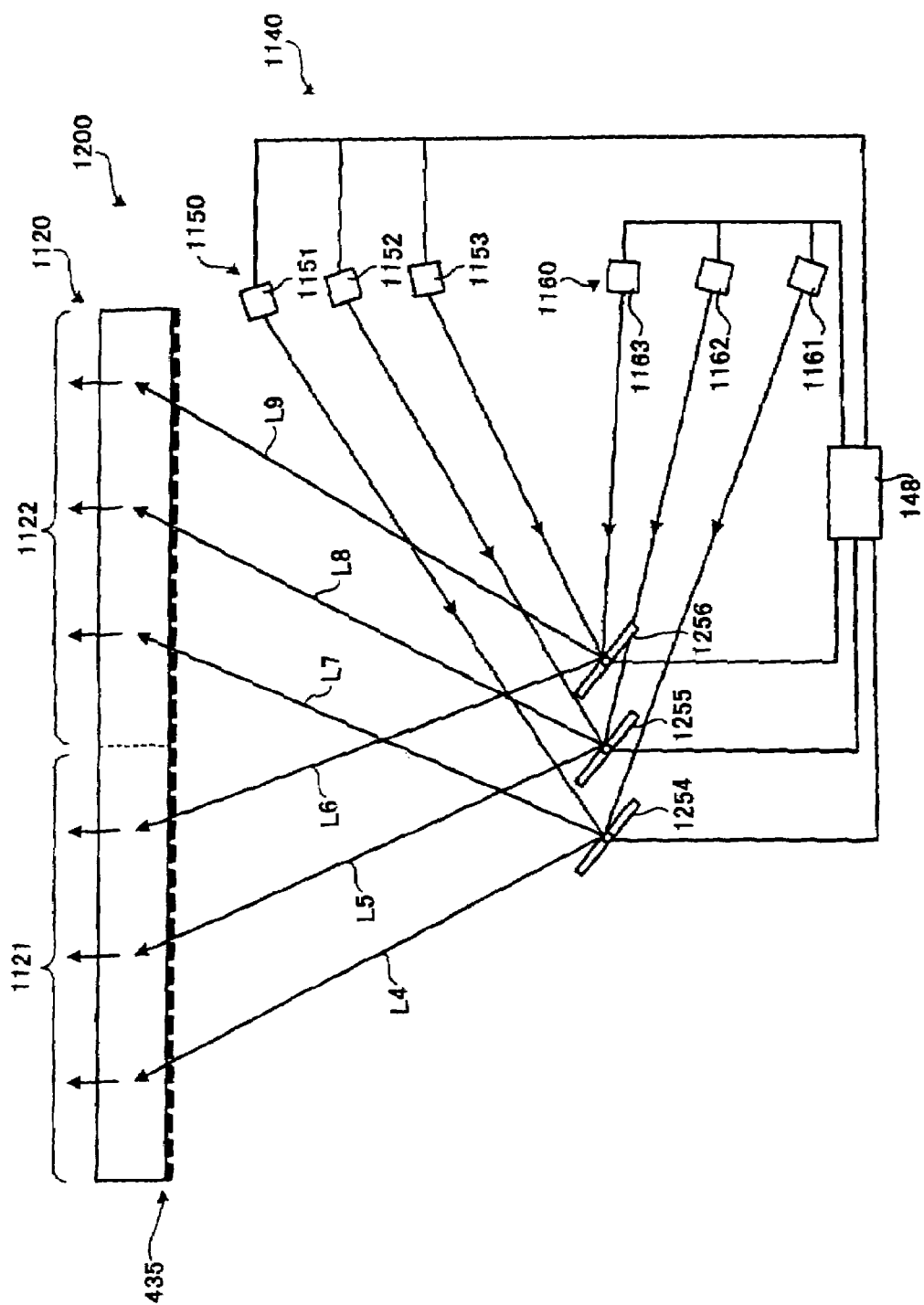
FIG. 12 is a schematic constructional view of a display apparatus according to a modification to Exemplary Embodiment 5.

FIG. 12 is a schematic showing a display apparatus 1200 which is an exemplary modification to the display apparatus 1100 of this exemplary embodiment. Here, the same signs are assigned to the same portions as in the display apparatus 1100, and they shall not be repeatedly described. The display apparatus 1200 features that three galvanomirrors 1254, 1255 and 1256 are disposed. First control lights L4 and L7 from first light source portions for the control lights 1151 and 1161 in light source units for control lights 1150 and 1160, scan a first region 1121 and a second region 1122 by the galvanomirror 1254, respectively. Second control lights L5 and L8 from second light source portions for the control lights, 1152 and 1162 scan the first region 1121 and the second region 1122 by the galvanomirror 1255, respectively. Third control lights L6 and L9 from third light source portions for the control lights, 1153 and 1163 scan the first region 1121 and the second region 1122 by the galvanomirror 1256, respectively. Owing to the construction in which each single galvanomirror allows the plurality of control lights to scan in this manner, the number of components can be decreased.

Incidentally, although the organic EL layer is employed for the display panel in each of the foregoing exemplary embodiments, the present invention is not restricted thereto as long as light is emitted by applying a voltage. By way of example, the organic EL layer may well be replaced with an inorganic EL layer. Besides, in each of the foregoing exemplary embodiments, the display apparatus performs an analog control which displays a continuous change magnitude by the control light L modulated in accordance with the image signal. However, this is not restrictive, but a digital control may well be performed using the control light L. By way of example, only two discontinuous values may well be taken in accordance with the ON and OFF states of the control light L, so as to represent a gradation by employing subframe drive.

INDUSTRIAL APPLICABILITY

As described above, a display apparatus according to exemplary embodiments of the present invention is useful for presentation and in case of displaying a dynamic image, and it is suited especially in the case of displaying a projection image.

What is claimed is:

1. A display panel, comprising:
    a first optically transparent electrode layer;
    a second optically transparent electrode layer;
    a conductivity-variable layer provided on the first optically transparent electrode layer; and
    an electroluminescent layer provided between the conductivity-variable layer and the second optically transparent electrode layer, which emits light by applying a voltage thereto;
    a predetermined voltage being applied between the first optically transparent electrode layer and the second optically transparent electrode layer, and the conductivity-variable layer having its electrical conductivity changed in accordance with a light quantity of control light transmitted through the first optically transparent electrode layer; and
    the electroluminescent layer emitting the light so that the voltage in the predetermined voltage as corresponds to the conductivity of the conductivity-variable layer, is applied thereto when the conductivity of the conductivity-variable layer has been changed in accordance with the light quantity of the control light transmitted through the first optically transparent electrode layer.

2. The display panel as defined in claim 1, the electroluminescent layer having a structure in which the electroluminescent layer is divided into a plurality of regions corresponding to pixels.

3. The display panel as defined in claim 2, further comprising:
    a light shield portion provided near a surface of the first optically transparent electrode layer where the control light enters, and which is formed with openings in correspondence with the pixels;
    each of the openings being arranged at a position through which the control light is passed, thereby to be entered into a position of the first optically transparent electrode layer as corresponds to a predetermined one of the pixels; and
    the electroluminescent layer emitting the light on the pixel basis so that the control light passed through the opening is entered into only a part of the first transparent electrode layer corresponding to the predetermined pixel.

4. The display panel as defined in claim 2, the electroluminescent layer having a structure that is divided into a plurality of regions corresponding to the pixels, by a plurality of partition members provided on the conductivity-variable layer.

5. The display panel as defined in claim 2,
    the electroluminescent layer including a reflection electrode provided in correspondence with the pixels, on its surface on a side which lies in touch with the conductivity-variable layer; and
    the reflection electrode having a region which is larger than a region of the electroluminescent layer that corresponds to each of the pixels.

6. The display panel as defined in claim 2, the conductivity-variable layer having a structure that is divided into a plurality of regions corresponding to the pixels.

7. The display panel as defined in claim 2,
    the plurality of regions of the electroluminescent layer being provided in correspondence with pixels for first color light, pixels for second color light, and pixels for third color light;
    each pixel aggregate being constructed of one of the pixels for the first color light, one of the pixels for the second color light, and one of the pixels for the third color light; and
    a plurality of such pixel aggregates being provided at substantially equal intervals in two predetermined directions being substantially orthogonal to each other.

8. A display apparatus, comprising:
    a display panel;
    a power source which applies a voltage to the display panel; and
    an optical system for control light, which supplies control light to the display panel;
    the display panel being the display panel as defined in claim 1, and the power source applies the voltage between the first optically transparent electrode layer and the second optically transparent electrode layer of the display panel; and
    the optical system for the control light entering the control light into the first optically transparent electrode layer of the display panel.

9. The display apparatus as defined in claim 8, the optical system for the control light passing the control light through each opening, thereby to enter the control light into only the position of the first transparent electrode layer corresponding to a predetermined pixel.

10. The display apparatus as defined in claim 8,:
    the optical system for the control light including a plurality of light source units for the control lights;
    each of the light source units for the control lights consisting of a first light source portion for the control light that supplies the first control light to a part of the first optically transparent electrode layer corresponding to the pixel for the first color light, a second light source portion for the control light that supplies the second control light to a part of the first transparent electrode layer corresponding to the pixel for the second color light, and a third light source portion for the control light that supplies the third control light to a part of the first transparent electrode layer corresponding to the pixel for the third color light; and
    the plurality of light source units for the control lights supplying the first control light, the second control light and the third control light to different regions of the display panel, respectively.

11. The display apparatus as defined in claim 8, comprising:
    a frame in which, at least the optical system for the control lights is accommodated;
    the display panel being mounted on the frame.

12. The display panel as defined in claim 1, light from another image display apparatus being employed as the control light.

* * * * *